United States Patent [19]
Bowman et al.

[11] Patent Number: 5,749,226
[45] Date of Patent: *May 12, 1998

[54] MICROMINIATURE STIRLING CYCLE CRYOCOOLERS AND ENGINES

[75] Inventors: Lyn Bowman, Athens, Ohio; Jarlath McEntee, Castine, Me.

[73] Assignee: Ohio University, Athens, Ohio

[*] Notice: The term of this patent shall not extend beyond the expiration date of Pat. No. 5,457,956.

[21] Appl. No.: 541,260

[22] Filed: Oct. 12, 1995

Related U.S. Application Data

[63] Continuation-in-part of Ser. No. 333,356, Nov. 2, 1994, Pat. No. 5,457,956, which is a continuation of Ser. No. 190,582, Feb. 2, 1994, abandoned, which is a continuation of Ser. No. 17,265, Feb. 12, 1993, abandoned.

[51] Int. Cl.$^6$ .................................................. F02G 1/04
[52] U.S. Cl. .................................................. 60/520; 62/6
[58] Field of Search .......................... 60/520, 525, 518, 60/517; 62/6; 290/1 R; 29/888, 890.034, 890.035

[56] References Cited

U.S. PATENT DOCUMENTS

| | | | |
|---|---|---|---|
| 3,548,589 | 12/1970 | Cooke-Yarborough . | |
| 3,604,821 | 9/1971 | Martini | 62/6 |
| 4,350,012 | 9/1982 | Folsom et al. | 62/6 |
| 4,406,124 | 9/1983 | Chagnot | 60/520 |
| 4,802,332 | 2/1989 | Beale | 60/520 |
| 5,488,830 | 2/1996 | Burt | 60/520 |
| 5,502,968 | 4/1996 | Beale | 60/520 |
| 5,519,999 | 5/1996 | Harpole et al. | 60/520 |

OTHER PUBLICATIONS

Silicon as a Mechanical Material, K.E. Petersen, 1982.
Microminiature refrigeration, W.A. Little, 1984.
Frequency Response Of Polycrystalline Silicon Microbridges, R.T. Howe and R.S. Muller, 1985.
Pressure Dependence Of Resonant Diaphragm Pressure Sensors, J.G. Smits, H.A.C. Tilmans and T.S.J. Lammerink, 1985.
A Piezoelectric Micropump Based On Micromachining Of Silicon, H.T.G. van Lintel, F.C.M. van de Pol and S. Bouwstra, 1989.
Study On Microengines: Miniaturizing Stirling Engines For Actuators, N. Nakajima, K. Ogawa and I. Fujimasa, 1989.
*Cryocoolers, Part 1: Fundamentals*, by Graham Walker, 1983 Plenum Press, New York, pp. 185–236, especially pp. 212–220.
*A Linear Model of a Free–Piston Vuilleumier Machine Compared to Experimental Results of a Prototype*, S. Schulz and B. Thomas, 27th Intersociety Energy Conversion Conference Proceeding, IECEC 1992, San Diego, CA, Aug. 3–7, 1992, vol. 5, pp. 5.75–5.80.

*Primary Examiner*—Marguerite McMahon
*Attorney, Agent, or Firm*—Frank H Foster; Kremblas, Foster Millard & Pollick

[57] ABSTRACT

A microminiature Stirling cycle engine or cooler is formed utilizing semiconductor, planar processing techniques. Such a Stirling cycle thermomechanical transducer has silicon end plates and an intermediate regenerator. The end plates are formed with diaphragms and backspaces, one end plate forming the expansion end and the opposite end plate forming the compression end, with the regenerator bonded in between. A control circuit apparatus is linked to the diaphragms for controlling the amplitude, phase and frequency of their deflections. The control circuit apparatus is adapted to operate the transducer above 500 Hz and the passages and the workspace, including those within the regenerator, expansion space and compression space, are sufficiently narrow to provide a characteristic Wolmersley number, which is characteristic of the irreversibilities generated by the oscillating flow of the working fluid in the workspace, below substantially 5 at the operating frequency above 500 Hz. Additionally, the amplitude of the vibrations of the diaphragm vibrations are sufficiently small to provide the working fluid a maximum Mach number below substantially 0.1 at an operating frequency above 500 Hz.

47 Claims, 27 Drawing Sheets

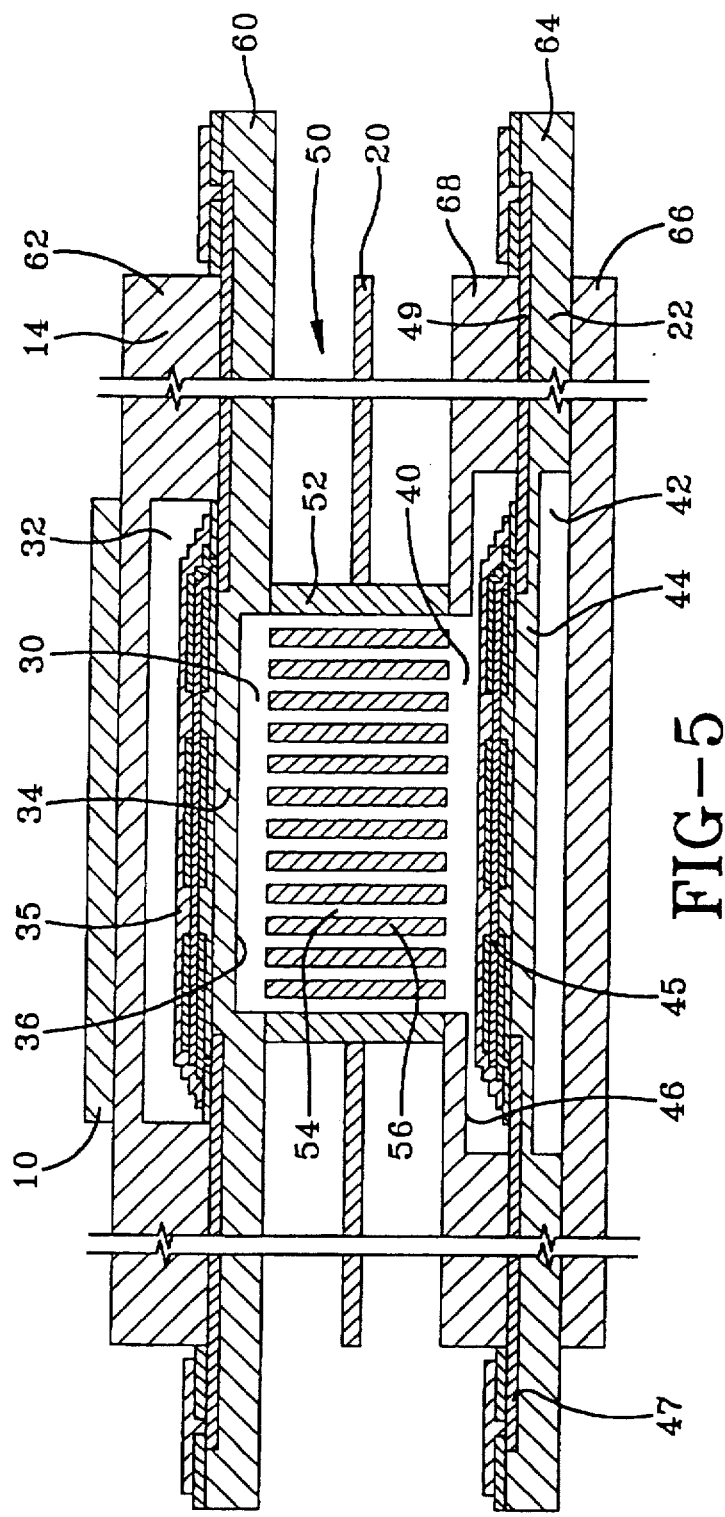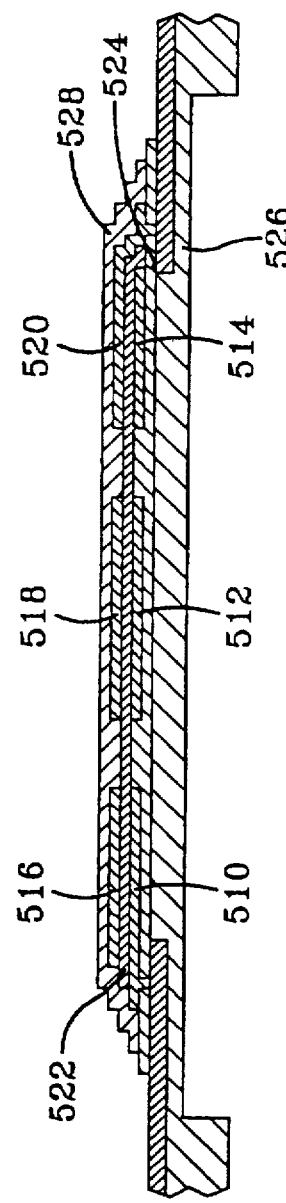

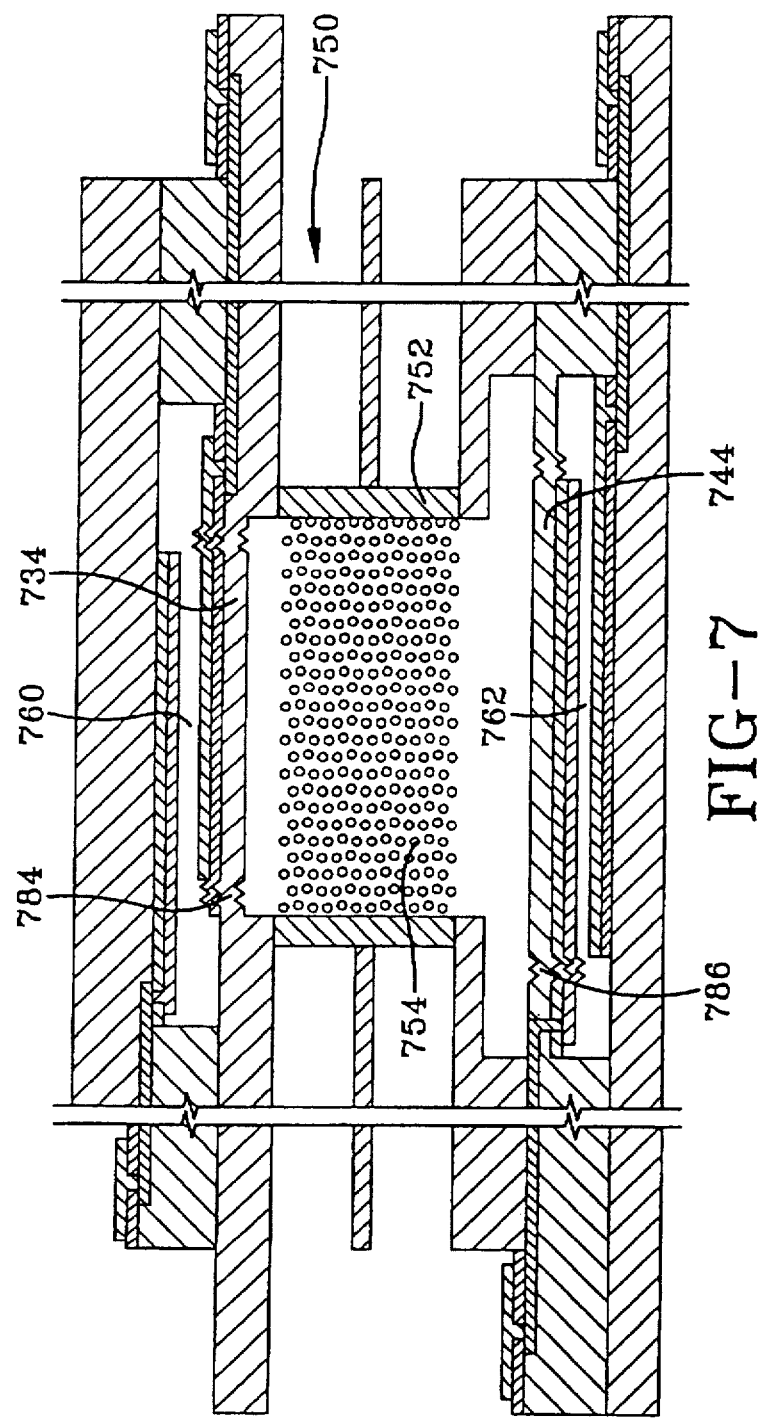
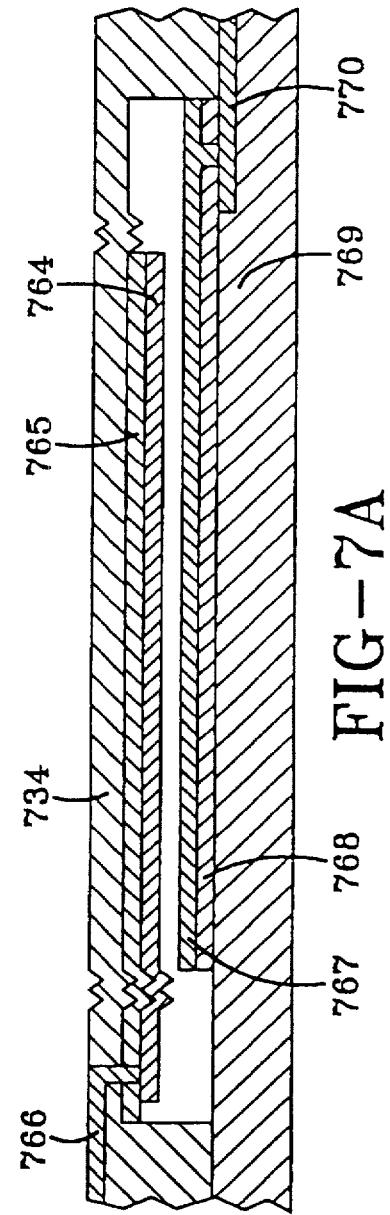
FIG-7
FIG-7A

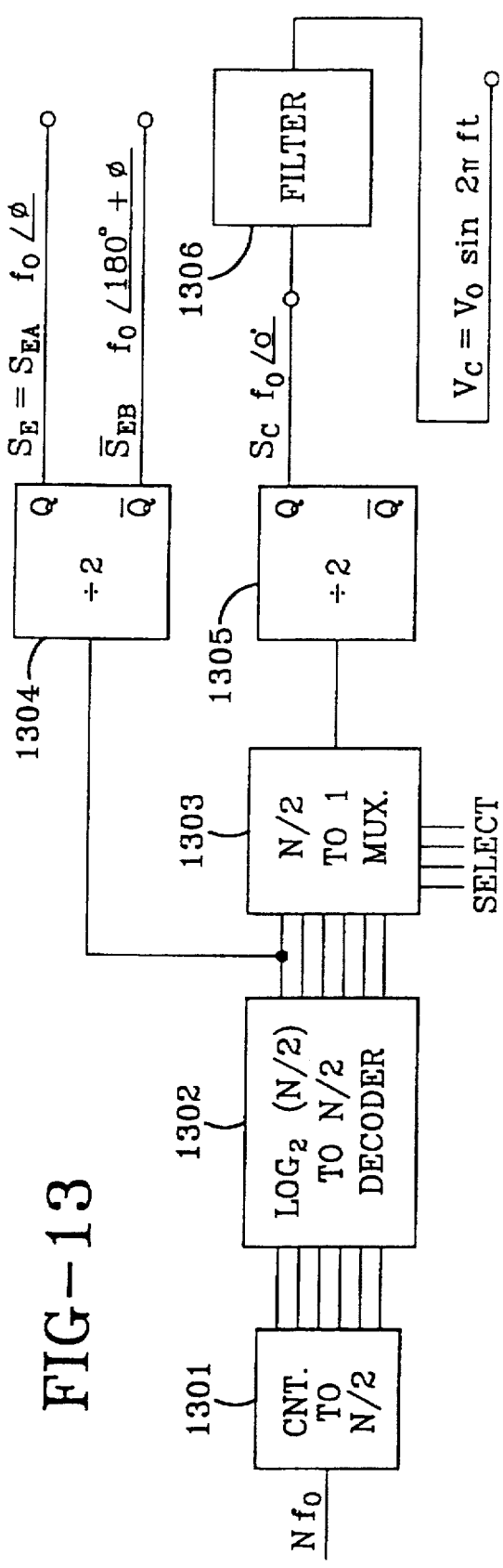
FIG-13
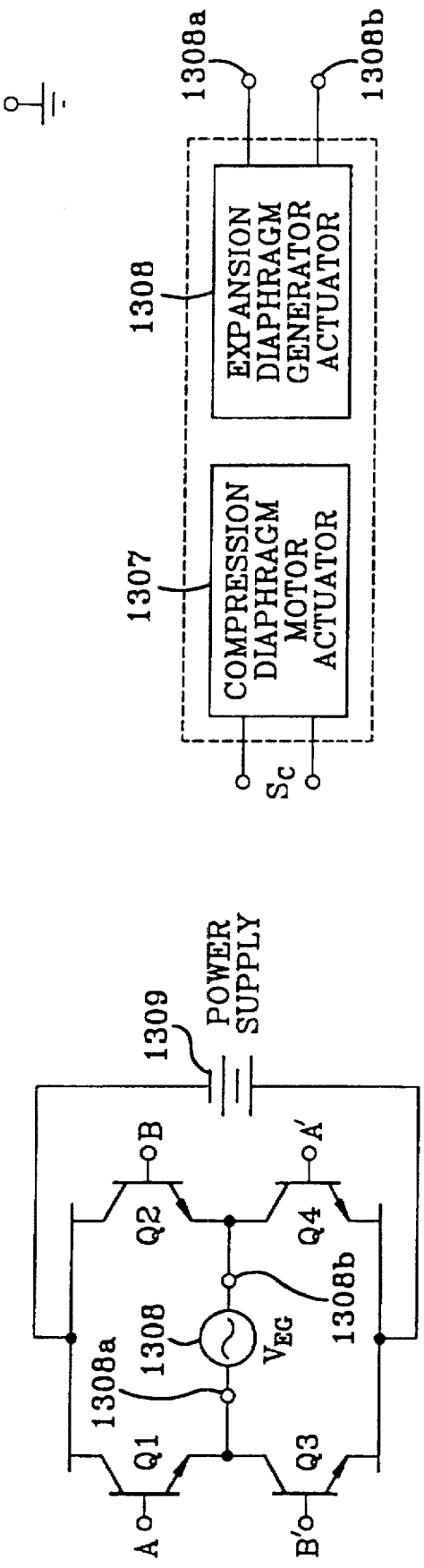
FIG-15
FIG-14

MICROMINIATURE STIRLING CYCLE CRYOCOOLERS AND ENGINES

This application is a continuation-in-part of application Ser. No. 08/333,356, filed Nov. 2, 1994, which will issue as U.S. Pat. No. 5,457,956 on Oct. 17, 1995, which is a continuation of application Ser. No. 08/190,582, filed Feb. 2, 1994, now abandoned, which is a continuation of application Ser. No. 08/017,265, filed Feb. 12, 1993, now abandoned.

TECHNICAL FIELD

This invention relates generally to Stirling cycle engines and cryocoolers and more particularly relates to such Stirling thermomechanical transducers which are particularly useful for cooling integrated electronic circuits to cryogenic temperatures and as engines for driving micromachines.

BACKGROUND ART

Because of the advantageous electronic properties exhibited by various materials at cryogenic temperatures, various machines have been developed for cooling electronic devices so that they may be operated at cryogenic temperatures. Many such refrigeration systems have used Stirling cycle cryogenic coolers. Such existing machines, however, are relatively large, bulky, inefficient and noisy machines generating substantial vibration. While technology has developed to permit a remarkable miniaturization of electronic circuitry, thereby permitting large numbers of electronic circuits to be contained within a relatively small volume, the apparatus which is available for cooling such circuits is relatively large and consequently adds a substantial, additional volume and weight to cryogenic electronic circuitry. There is, therefore, a need for an efficient Stirling cycle cryocooler which can be miniaturized so that its size and weight are compatible with and do not add substantially to that of the electronic circuitry but are, nonetheless, capable of pumping heat at a sufficient rate to maintain the cryogenic temperatures.

A measure of the size and effectiveness of a cooler in pumping thermal energy is its specific capacity. Specific capacity is the ratio of the quantity of thermal energy which the machine can pump to a quantitative measure of its size or weight. Thus, a cryocooler must not only be able to pump sufficient thermal energy from the electronic device to maintain it at a cryogenic temperature, but should do so with the smallest possible size or weight. Consequently, the higher the specific capacity, the more desirable is the cooler.

The prior art has recognized that the specific capacity of a Stirling cycle cooler can be increased and therefore improved by operating the cooler at a higher frequency. A sufficiently high, thermal energy pumping rate can be maintained if the cooler is made smaller, but the frequency of its operation is increased so that more thermal energy pumping cycles occur each second.

However, the prior art has also recognized that entropy generating processes (ie, irreversibilities) have imposed an upper limit on the frequency of operation of Stirling cycle machines. As the operating frequency is increased, viscous dissipation resulting from the friction of the working fluid with the internal passage walls of the Stirling cryocooler also increases. As a result, more work is required to move the gas back and forth through the passages of the Stirling cycle machine at higher frequencies. In addition, the apparent thermal conductivity of the working fluid in the regenerator increases causing a larger amount of heat to be conducted into the cold end of the machine, and heat transfer in heat exchangers is reduced. The latter effects occur as a result of certain phase relationships between the periodic variations in axial mass flow and radial temperature gradient which arise in oscillatory flow. As a result, the amount of heat that must be pumped by the cryocooler is increased while the effectiveness of the cryocooler in exchanging heat with its surroundings is reduced. Consequently, increasing the frequency reduces the heat lifted. Therefore, the prior art has come to accept an upper frequency limit for Stirling cycle machines on the order of 50 Hz and a machine constructed to operate at 120 Hz is believed to be the highest frequency Stirling machine ever built.

There is, therefore, a need for a Stirling cryocooler which can lift heat at a sufficient rate to maintain electronic devices at cryogenic temperatures, but which also has a sufficiently small size and weight that it exhibits a specific capacity which is acceptable and compatible with the equipment which utilizes these electronic circuits.

Recent years have also seen the development of a micromachine technology. While such machines utilize mechanical devices, such as motion conversion linkages, mechanical advantage mechanisms, power trains, valves, diaphragms, cantilever beams and the like, which have configurations and modes of operation like conventional mechanical devices, they have a size on the order of a few millimeters or smaller.

Although Stirling cycle engines have long been used as mechanical prime movers, there is a need for a microminiature Stirling cycle engine for use with developing micromachine technology.

BRIEF DESCRIPTION OF THE INVENTION

The prior art discloses Stirling cycle, thermomechanical transducers having a pressure containing vessel, including fluid passages, and containing a compressible and expansible working fluid. The prior art also discloses the use of flexible diaphragms associated with the transport of the working fluid and the volume changes which are inherent with the Stirling cycle. Such diaphragms are combined with a control circuit apparatus or other means linked to the diaphragms for controlling the mode, amplitude, phase and frequency of their deflection.

The present invention utilizes the combination of certain masses and springs associated with the diaphragms, and pressure forces arising inside the transducer to controllably operate the Stirling cycle thermomechanical transducer above an operating frequency of 500 Hz, such as 1000 Hz for example, combined with passages in the work space which are sufficiently narrow to provide a Wolmersley number below 5 and diaphragm amplitudes sufficiently small to provide Mach numbers below 0.1 at the operating frequency. These narrow passages and small diaphragm vibration amplitudes sufficiently reduce the irreversibilities as work done in transporting the fluid and temperature drops in transporting heat to provide a machine which has an acceptably high, specific capacity. The result is that practical, sufficiently high specific capacities can be achieved at much smaller sizes than previously thought possible.

The invention also contemplates forming the heat regenerating region as well as the heat accepting and heat rejecting region of the Stirling cycle device of silicon and utilizing planar processing techniques such as photolithography, etching, oxidation, bonding and thin film technology to allow wafer-scale manufacturing, creating hundreds of microrefrigerator components simultaneously. The invention further contemplates the construction of arrays of such transducers and their construction both as coolers and engines. Further aspects of the invention are described below or will become apparent to those skilled in the art.

BRIEF DESCRIPTION OF DRAWINGS

FIG. 5 is a view in vertical section taken along the line 5—5 of FIG. 1.

FIG. 5A is an enlarged view in vertical section of a portion of the structure illustrated in FIG. 5.

FIGS. 6, 7, and 7A are views similar to those of FIGS. 4, 5, and 5A, but illustrating an alternative embodiment of the invention.

FIGS. 13–17 are block and schematic diagrams illustrating a control system for the present invention.

Figure 1:
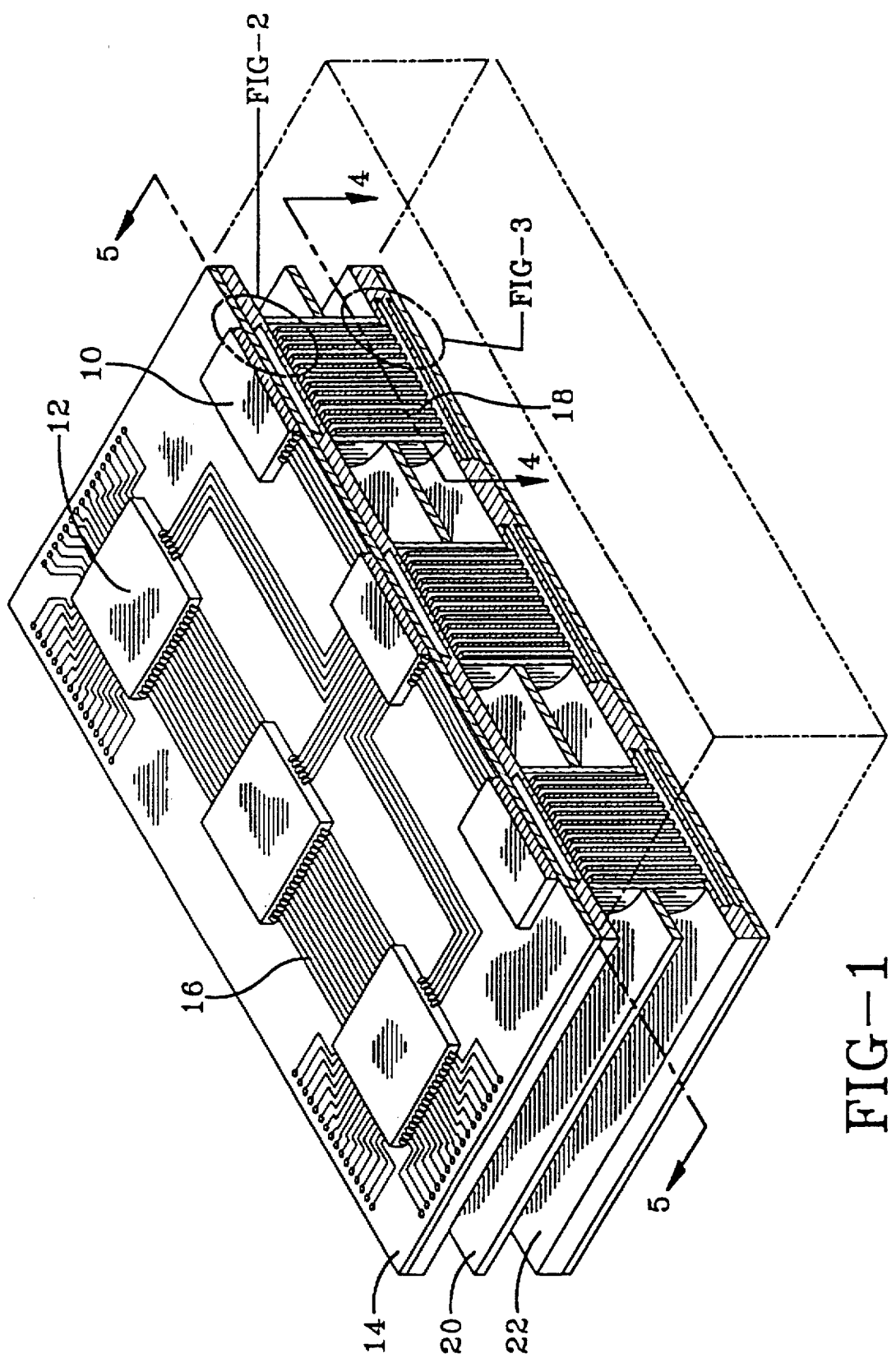
FIG. 1 is a view in perspective and in section illustrating an array of Stirling cycle transducers embodying the present invention for purposes of cooling electronic integrated circuits.
Figure 2:
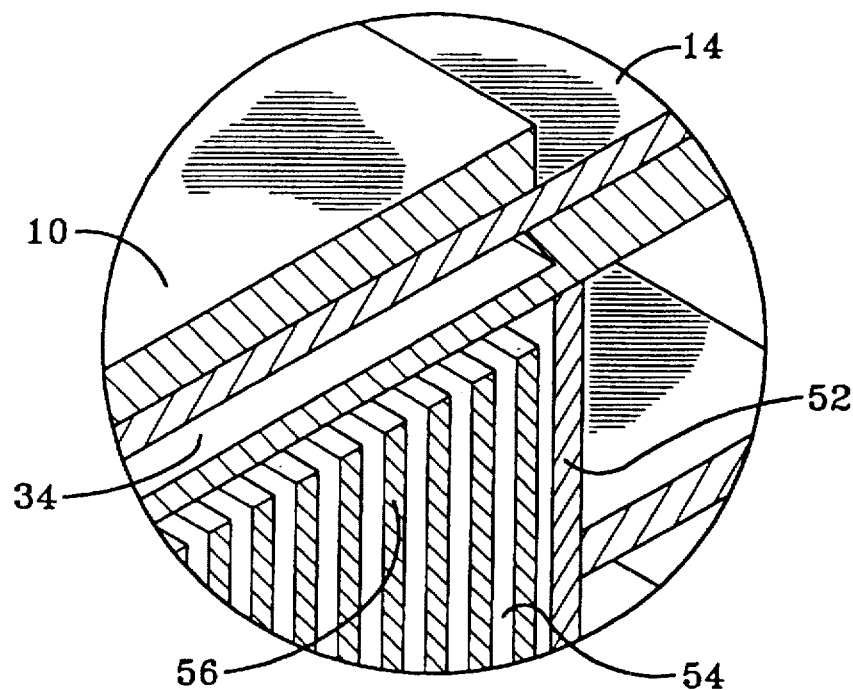
FIG. 2 is an enlarged view of a portion of FIG. 1 for illustrating detail.
Figure 3:
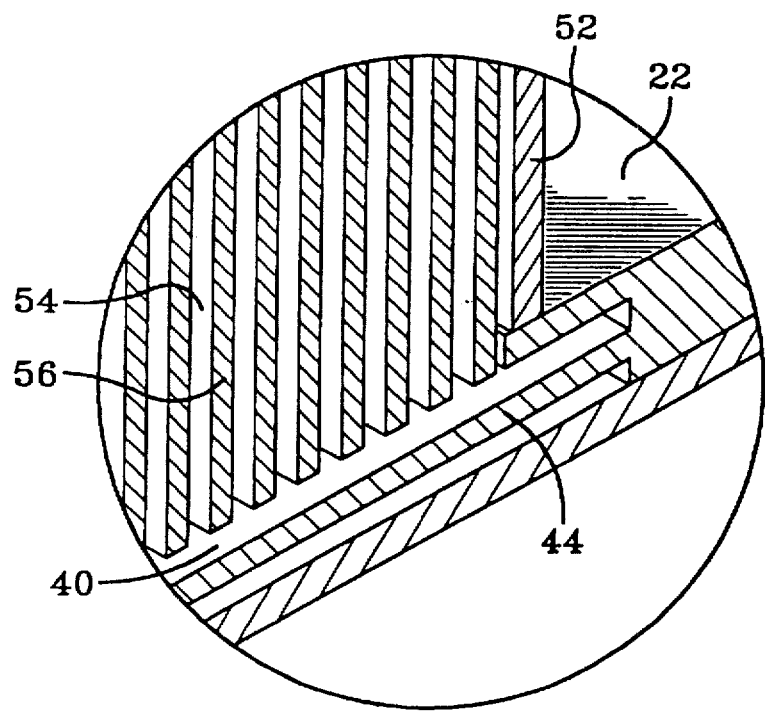
FIG. 3 is an enlarged view of another portion of FIG. 1 for illustrating detail.
Figure 4:
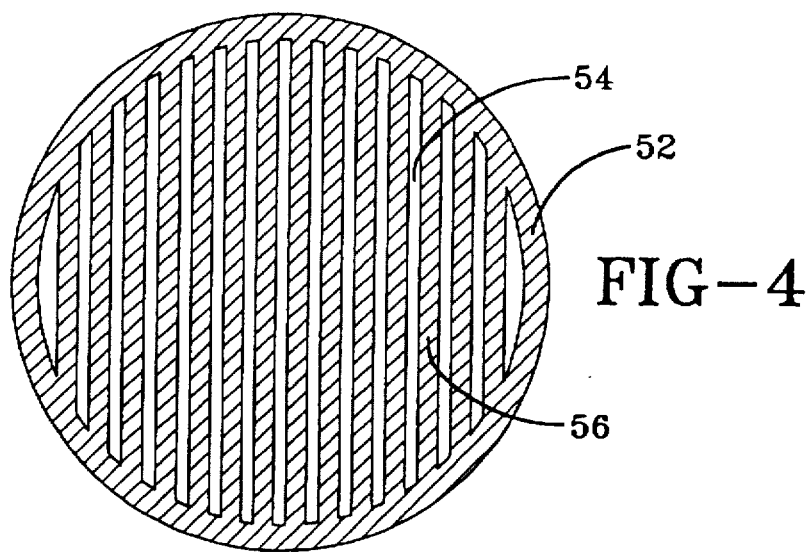
FIG. 4 is a view in horizontal section taken substantially along the lines 4—4 of FIG. 1.
Figure 6:
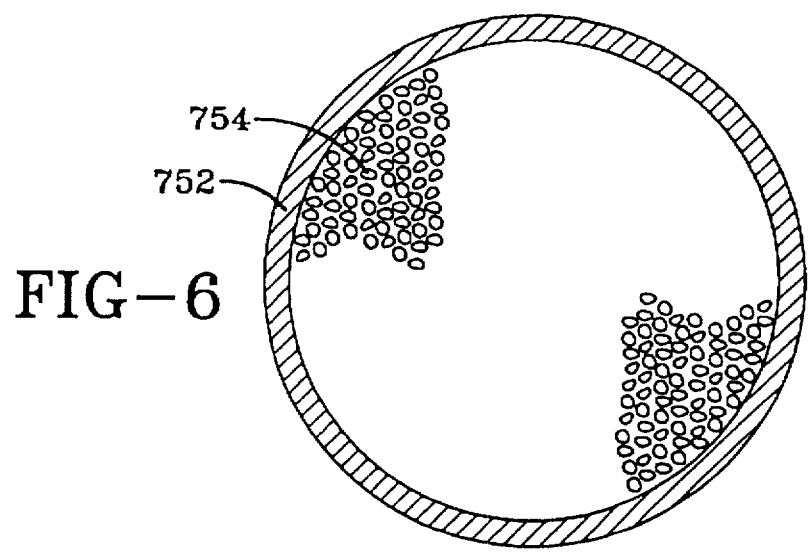

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose.

DETAILED DESCRIPTION

While the definitions of terminology, which is used in this document to describe the preferred and alternative embodiments of the invention, are generally known to those skilled in the art, it is desirable to briefly review and expressly define a few of the terms which will be used.

A "transducer" is a device for converting useful energy in one form to useful energy to another form. For example, energy may be converted from the energy of mechanical motion to an electrical current or from thermal energy to mechanical motion energy. Additionally, it is known that many transducers which can be operated in one mode, can also be operated in a reverse mode. For example, a device may be operated both as an electrical motor to convert energy from electrical current to mechanical rotation or reciprocation or it may be operated as a generator to convert such mechanical motion to electrical current. Similarly, a Stirling transducer may be operated either to convert thermal energy, flowing from a higher temperature to a lower temperature, to mechanical motion or it may be operated to utilize mechanical motion to pump thermal energy, i.e. heat, from a lower temperature to a higher temperature. Therefore, the devices of this invention are referred to as Stirling Cycle Transducers. Thus, it should be apparent that most features and embodiments of the present invention may be used both in the engine mode, as well as in a cooling or refrigerator mode.

The term "bonded" is used in a general sense to describe separately identifiable structures or layers which are mechanically joined, regardless of how they got that way. It includes not only two objects or layers which are first separately constructed and then joined together, but also includes two structures or layers which are integrally formed, grown or deposited one in connection to the other.

FIG. 1 illustrates six electronic, integrated circuits, such as integrated circuits 10 and 12, mounted upon a silicon substrate 14 and having interconnecting, conductor buses 16 formed on the substrate 14. Constructed beneath the integrated circuits are several Stirling coolers for removing heat from the integrated circuits. Although the figure shows one Stirling cooler associated with each integrated circuit, such one-to-one association is not necessarily required or implied. Each of these Stirling cycle coolers, such as the cooler 18, is a replication of the others and together they are shown arranged in a 2 by 3 array.

Spaced beneath the uppermost, silicon substrate 14 is a central support plate 20 for supporting the centrally positioned regenerator of each Stirling cooler. Although a single support plate is indicated as centrally located along the length of the regenerator, a multiplicity of support plates might be employed and located anywhere along the length of the regenerator, including at each end of the regenerator such as end support plates 1151 and 1153 shown in FIG. 11. Beneath and parallel to the central support plate 20 is a lowermost, second silicon substrate 22.

The uppermost silicon substrate 14, the lowermost silicon substrate 22 and the interposed portions of each Stirling cycle cooler form the pressure containing vessel of the Stirling cycle coolers. Each pressure containing vessel defines an enclosed workspace, including fluid passages, and contains a compressible and expansible fluid, typically a gas, all of which are needed for forming a Stirling cycle, thermomechanical transducer. In particular, the upper substrate 14 forms a heat accepting, fluid expansion end plate and the lower silicon substrate 22 forms a heat ejecting, fluid compression end plate for each Stirling cycle cooler. Interposed between these end plates is the heat regenerator which includes a perforate matrix in fluid communication with the end plates at its opposite ends.

These structures for one embodiment are illustrated in greater detail in FIGS. 2, 3, 4, and 5 and are described with reference to those figures. The end plates 14 and 22 may each comprise multiple, laminated layers. The structures of the end plates 14 and 22 are preferably formed utilizing planar processing technology of the type utilized in manufacturing electronic integrated circuits and silicon sensors and actuators.

The heat accepting, fluid expansion end plate 14 defines an expansion space 30, a back space 32 distal to the expansion space 30, and a flexible, expansion diaphragm 34 between the expansion space 30 and the backspace 32. A heat accepting, heat exchanger, proximately bounds the expansion space 30. In the preferred embodiment, the heat accepting heat exchanger is the heat accepting end plate 14, which bounds the work space along interior wall 36 and includes the diaphragm 34, although alternatives may be used as described below.

Similarly, the heat ejecting, fluid compression end plate 22 defines a compression space 40, a backspace 42 distal to the compression space 40, and a flexible, compression diaphragm 44 forming a wall between the compression space 40 and the backspace 42. A heat ejecting heat exchanger is formed by the end plate 22 which proximally bounds the compression space 40 along the interior wall 46.

In order to control the frequency, phase and amplitude of the diaphragms, each is provided with an actuator which is a part of a control system. The expansion diaphragm 34 has an associated actuator 35 and the compression diaphragm 44 has an associated actuator 45. The actuators may, for example, include piezoelectric materials, which are electrically connected to the remainder of the control system. Actuators are subsequently discussed in more detail below.

Interposed between the heat accepting end plate 14 and the heat ejecting end plate 22 is a heat regenerator 50, supported in place by the central support plate 20. The heat regenerator 50 has a surrounding, typically cylindrical, gas impervious wall 52 which contains the working gas and is sealingly connected to the end plate 14 and the end plate 22. Supported within the surrounding wall 52 is a perforate matrix 54 in fluid communication with both the expansion space 30 and the compression space 40. The perforate matrix illustrated in FIG. 4 comprises a plurality of spaced, planar walls 56 connected at their opposite sides to the surrounding wall 52. Preferably the passages between these walls have a cross-sectional aspect ratio greater than approximately 8.

The perforate matrix which forms the regenerator may have a variety of configurations. It is a structure with passages which communicate axially through the regenerator from the expansion space 30 to the compression space 40. The regenerator must be capable of transporting the gas axially and cyclically storing and releasing heat periodically so that the heat is pumped axially through the regenerator in increments for each cycle. The passages may be formed in a regular pattern between layers of material or may be a series of homogeneously distributed, interconnected pores in a foam-like material. Various alternative embodiments of such regenerator structures are subsequently described.

It is desirable that the regenerator exhibit a very high internal surface area to maximize the gas/regenerator interfacing surface and have a high thermal capacity for the storage of heat. It is also desirable to minimize the thermal conductivity through the regenerator material along the axial direction between the end plate 14 and the end plate 22. In a cooler, any heat conducted through the regenerator material represents heat conducted back into the end being cooled and in an engine represents shunted heat which provides no mechanical work output. Consequently, a low thermal conductivity material, such as ceramic or glass, is preferred, as well as a structure having a low geometrical, cross-section of mass.

It is a critically important feature of the present invention that the diameter or other corresponding lateral dimensions of the passageways through the perforate matrix of the regenerator be very small. It must be sufficiently small to provide a Wolmersley number below 5 at the operating frequency of the Stirling thermomechanical transducer in order to minimize the irreversibility losses associated with transporting the gas through those passages. Another critically important feature in order to minimize the irreversibility losses associated with transporting the working fluid through the aforesaid passages in the present invention is that the amplitude of diaphragm vibrations be very small. It must be sufficiently small to provide a maximum Mach number substantially below 0.1 at the operating frequency of the Stirling thermomechanical transducer.

These irreversibilities are a source of parasitic losses arising from a generation of heat by friction between the working gas and the passage walls. It results in viscous dissipation, from increased heat conduction by the working gas through the regenerator, and from reduced heat transfer in heat exchangers as the working frequency increases, the latter two phenomena being peculiar to oscillatory flow as a result of certain phase relationships between the periodic variations in axial mass flow and the radial temperature gradient. In the present invention the lateral dimensions of these flow passages are on the order of 10–50 microns and the amplitudes of diaphragm vibrations are on the order of 10–100 microns in order to compensate for the increase in frequency. The use of such small passages and vibration amplitudes reduces these parasitic losses. The reductions in these losses correspondingly increase the useful work which may be performed by the Stirling cycle, thermomechanical transducer in lifting heat or providing mechanical work.

A quantitative indication of the irreversibilities associated with oscillatory fluid flow in a passageway is given by the Wolmersley number. It is expressed by the equation:

$$\alpha = (2\pi f \cdot a^2 \rho / \eta)^{1/2} \qquad \text{I.}$$

wherein:
$\alpha$=Wolmersley Number
f=operating frequency
a=passageway diameter $\rho$=working fluid density (which is a function of temperature and pressure)
$\eta$=working fluid dynamic viscosity (a function of temperature)

Another quantitative indication of irreversibilities associated with fluid flow in a passageway is given by the Mach number. It is expressed by the equation:

$$Ma = 2\pi f \cdot x_g / c_o \qquad \text{II.}$$

wherein:
Ma=Mach number
$x_g$=the amplitude of oscillating axial gas displacement
$c_o$=the velocity of sound in the working fluid The axial oscillating working fluid displacement is related to the amplitude of diaphragm vibration by the equation:

$$x_g = x_d \cdot A_d / A_x \qquad \text{III.}$$

wherein:
$X_d$=the amplitude of diaphragm vibration
$A_d$=the area of the diaphragm vibration
$A_x$=the total cross-sectional area of all the passageways through which the working fluid flows The velocity of sound in the working fluid is well known as:

$$c_o = (\gamma RT)^{1/2} \qquad \text{IV.}$$

wherein:
$\gamma$=the ratio of specific heats at constant pressure and constant volume=5/3 for helium
R=the specific gas constant for the working fluid=2079 joules/kilogram•kelvin for helium
T=absolute temperature in kelvin Equations II, III, and IV can be combined to give:

$$Ma = (2\pi f \cdot x_d \cdot A_d / A_x) / (\gamma RT)^{1/2} \qquad \text{V.}$$

In order to obtain the advantages of the present invention for operating the Stirling cycle transducer above 500 Hz, the passages must be made sufficiently narrow to provide a Wolmersley number less than 5 and the amplitude of diaphragm vibrations must be sufficiently small to provide a maximum Mach number substantially less than 0.1 at the operating frequency. Preferably the Wolmersley number is made less than 1 and the maximum Mach number is made less than 0.01.

An example illustrating the parameters of a Stirling cycle transducer embodying the present invention illustrates the application of these principles of the present invention. The example is directed to the use of a perforate heat exchanger of the type illustrated in FIGS. 8 and 9 and described below.

The following example is for such a three-part microrefrigerator, charged with helium to 20 bars and operating at 1 kHz. Because there is a temperature gradient axially through the Stirling cycle cooler embodying the present invention, the temperature, and therefore the other parameters, are different at different axial positions. The following tables show one illustrative set of parameters wherein the well known Reynolds number is related to the previously defined quantities by:

$$Re = \alpha^2 x_g / a \qquad \text{VI}$$

TABLE 1

| Location | Temp. (°K) | $x_g$ (μm) | a (μm) | ρ (kg/m³) | η (× 10⁻⁶ Pa·s) | Re | α |
|---|---|---|---|---|---|---|---|
| Cold Heat Exchanger | 100 | 200 | 10 | 9.8 | 9.5 | 13 | 0.81 |
| Mid-Regenerator | 225 | 300 | 20 | 4.3 | 16.2 | 10 | 0.82 |
| Warm Heat Exchanger | 350 | 600 | 30 | 2.8 | 21.8 | 9.7 | 0.85 |

TABLE 2

| Location | Temp. (°K) | $x_d$ (μm) | $A_d$ (× 10⁻⁶ m²) | $A_x$ (× 10⁻⁶ m²) | Ma |
|---|---|---|---|---|---|
| Cold Heat Exchanger | 100 | 100 | 64 | 32 | 0.002 |
| Mid-Regenerator | 225 | 100* | 180* | 32 | 0.004 |
| Warm Heat Exchanger | 350 | 100 | 290 | 32 | 0.005 |

*In the regenerator, averages of the two diaphragm displacements and areas are used, because the gas displacement is influenced by both diaphragms.

[CONTROL SYSTEM]

The theory of operation and various embodiments for controlling the phase and frequency of the expansion diaphragm 34 and the compression diaphragm 44 are taught by the prior art and therefore are not described in detail. Such operation is described, for example, in the Cooke-Yarborough U.S. Pat. No. 3,548,589. As the diaphragms vibrate they move alternately into and away from their respective, associated expansion and compression spaces, thereby periodically varying the effective volume of these spaces, alternately transporting gas into and out of the respective expansion and compression spaces.

Figure 12:
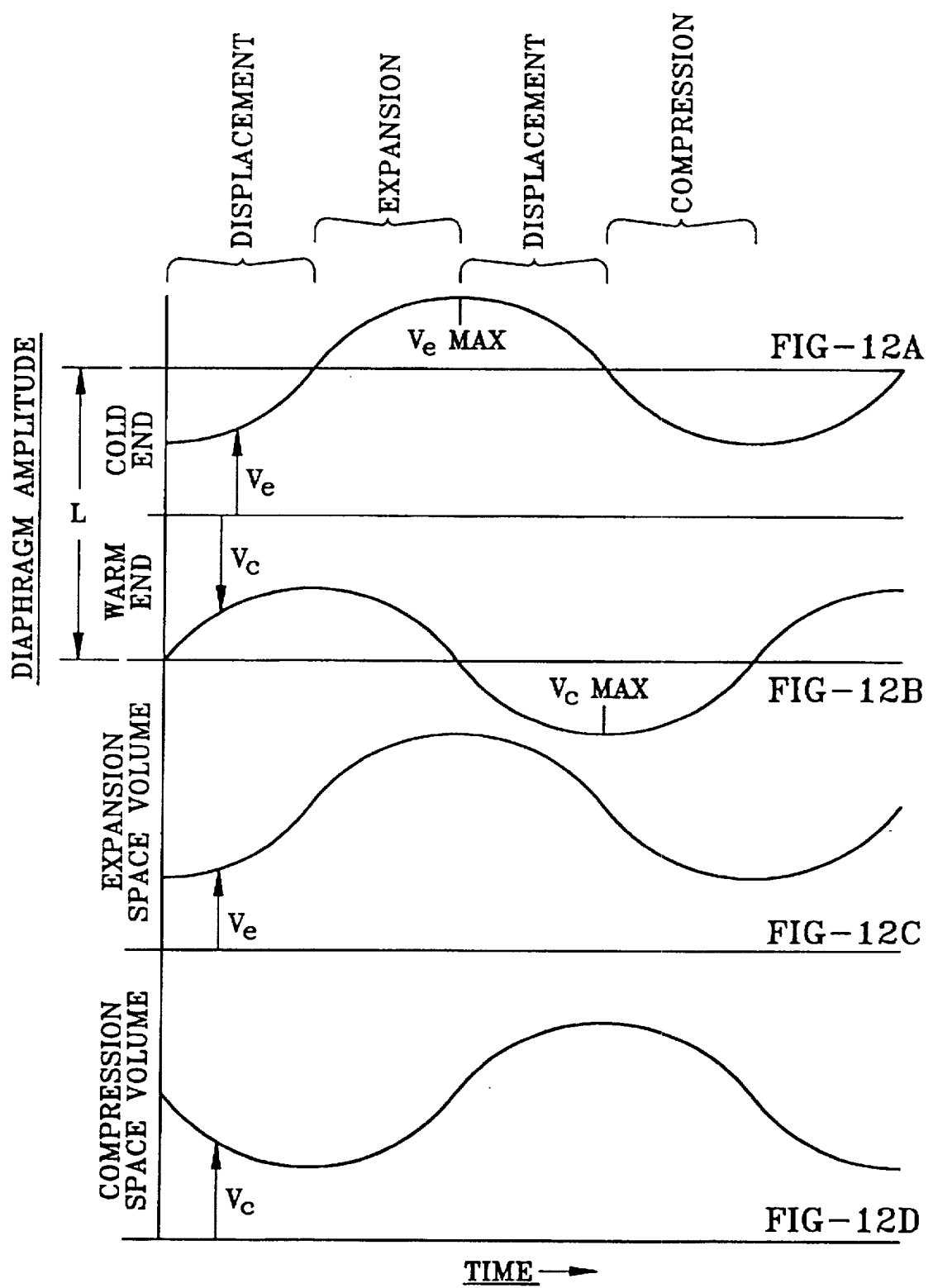
FIG. 12 consists of four graphs illustrating the displacement and volume variations of an embodiment of the invention.

FIG. 12, graphs 12A and 12B, illustrate the loci of the diaphragm displacement with respect to time at the opposite ends of the regenerator. Because these diaphragms face one another at opposite ends, a motion in opposite directions (for example, toward the center) has the same effect in changing the volume of their associated spaces. Thus, volume changes with respect to time for the expansion and compression spaces appear in FIGS. 12A and 12B as volumes $V_e$ and $V_c$. FIGS. 12C and 12D are provided to illustrate the changes in the expansion space volume $V_e$ and compression space volume $V_c$ with respect to time. As illustrated in these figures, the control system must control the diaphragms so that the expansion space volume leads the compression space volume by a nominal or approximate 90°. However, the phase lead is not necessarily exactly 90, as known to those skilled in the art, and may vary, for example, by as much as 10° or 20° for optimizing efficiency. For engines and coolers, the preferred volume phase leads are greater than 90°. This approximate 90° phase lead must be maintained for both coolers and engines.

In order to maintain the proper phase, amplitude and frequency for the periodic motion of the diaphragms, the control system includes an actuator, such as the actuators 35 and 45 referred to above. Preferably each actuator is an electro-mechanical transducer, mechanically linked to its associated diaphragm. Suitable transducers include magnetic transducers, such as taught by the above Cooke-Yarborough patent, piezoelectric transducers, magnetostrictive transducers, capacitive transducers or other transducers which can drive the diaphragms. Electromechanical transducers are preferred because of the ease of making connections to them and the ease of controlling the phase, amplitude and frequency of electrical drive signals.

As is known to those skilled in the art of alpha configuration, Stirling cycle transducers, the working fluid does work on the piston associated with the expansion space, while the piston associated with the compression space does work on the working fluid. Transducers are required for both pistons, to drive the piston associated with the compression space, to dissipate power from the piston associated with the expansion space, and to control the amplitude, frequency, and phase of the motion of each piston. energy to or from the diaphragm and is not limited to those which only give mechanical work output. Therefore, it is the purpose of the control system, including the actuators, to cause the diaphragms to vibrate with the desired phase relation, amplitude and frequency.

Figure 16:
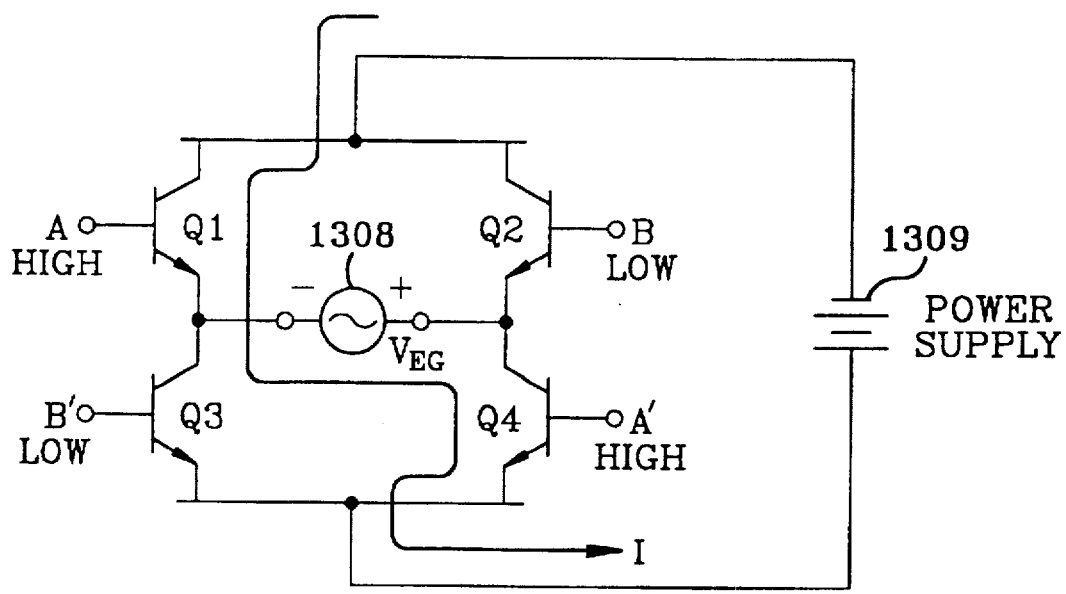
Figure 17:
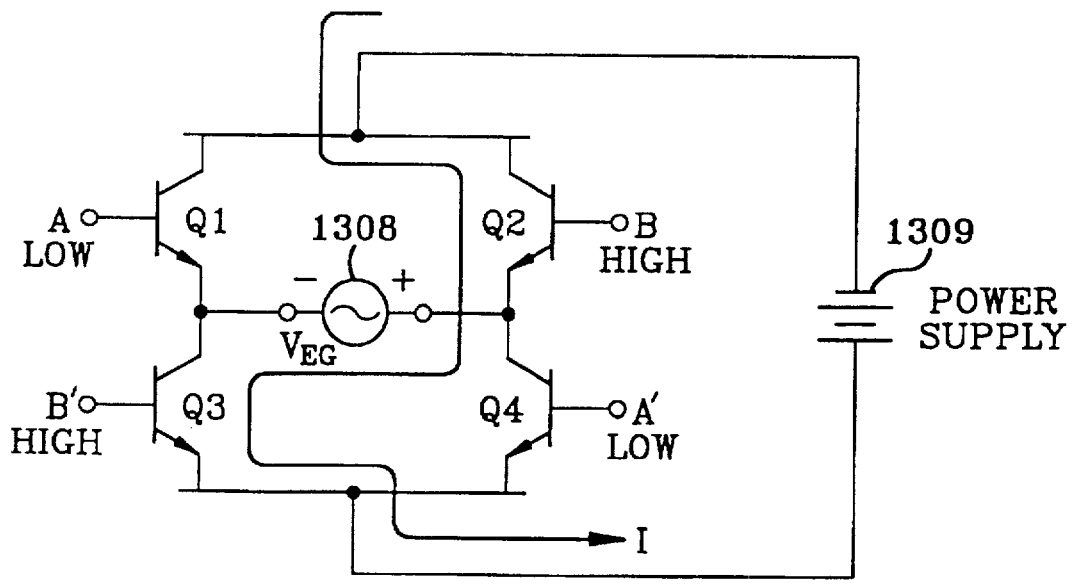

A representative control system for maintaining the desired phase, amplitude and frequency of diaphragm vibrations is illustrated in FIG. 13. Digital pulse train control signals $S_C$, $S_{EA}$ and $S_{EB}$, at the resonant frequency $f_0$ of the microrefrigerator are derived by means of a digital counter 1301, decoder 1302, multiplexer 1303, and dividers 1304 and 1305 from a single digital pulse train at a multiple of the resonant frequency $Nf_0$. The phase lead of $S_{EA}$ with respect to $S_c$ is chosen by the Select inputs of the multiplexer 1303 to an arbitrary precision determined by the width of the data path of digital counter 1301, decoder 1302, and multiplexer 1303. The fundamental sinusoidal component $S_{CO}$ of control signal $S_C$ is extracted by the filter 1306 and applied to the compression diaphragm motor-actuator 1307 shown in FIG. 15. Control signal $S_{EA}$ and its inverse $S_{EB}$ are applied to the control terminals A and A' and B and B', respectively, of a H-bridge of transistors Q1–Q4 shown in FIG. 14. Excitation of this H-bridge by control signals $S_{EA}$ and $S_{EB}$ actively rectifies the alternating voltage $V_{EG}$ generated by expansion diaphragm generator-actuator 1308 and appearing at its terminals 1308a and 1308b for charging the DC power supply 1309 that back-biases the H-bridge. FIGS. 16 and 17 illustrate the directions of electrical current flow generated by the expansion diaphragm generator-actuator 1308 through the H-bridge during alternate phases of the control signals $S_{EA}$ and $S_{EB}$. By this arrangement, electrical power flows from power supply 1309 into the compression diaphragm motor-actuator 1307 and out of the expansion diaphragm generator-actuator 1308 into power supply 1309. The difference between the amount of electrical power that flows out of and into power supply 1309 is the net power consumption of the micro-refrigerator. Transistors Q1–Q4 are illustrated as bipolar transistors, but minor circuit modifications would permit the same function to be performed by MOS or JFET transistors.

[Integral End Plate Alternatives.]

The use of silicon for forming the end plates 14 and 22 affords unique and major opportunities for the construction of a Stirling cycle, thermomechanical transducer. Because one important function of the end plates is to conduct heat, silicon provides advantageous results because it exhibits a high, thermal conductivity. Secondly, the choice of silicon permits the end components of the Stirling cycle transducer to be formed utilizing prior art silicon planar processing techniques which have been used in the past for forming integrated, electronic circuits and silicon transducers. Thirdly, the use of silicon permits such integrated electronic circuits to be joined to the expansion end plate 14 with high reliability, despite the thermal cycling of the structure, because thermomechanical stress between the integrated circuits and the cold plate is eliminated due to their identical thermal coefficients of expansion. Fourthly, the use of silicon permits the electronic circuits to be formed integrally with or within the expansion end plate 14 to maximize the thermal conductivity for pumping heat away from the electronic circuitry.

For example, and referring to FIG. 5, the end plate 14 may comprise two silicon layers, an interior layer 60 and a cover layer 62. The diaphragm 34 is formed by conventional, planar processing etching to form the expansion space 30, and leaving the diaphragm 34. Backspace 32 is enclosed by bonding the cover layer 62 to the interior layer 60 so that the two silicon wafers are joined together in the plane by prior art techniques, such as silicon fusion bonding or the use of an intermediary film of glass or metal or an anodic bond. Similar or related techniques are also used for forming the backspace 42 and the workspace 40 in the compression end plate 22, which consists of interior layer 64 and cover layers 66 and 68.

The areas of the expansion and compression diaphragms may be either identical or different as indicated in FIG. 5.

[Heat Exchanger Alternatives.]

In embodiments of the invention heat is conducted through the expansion end plate 14 and transferred into the expansion space 30 and is also transferred from the compression space 40 into and then conducted through the compression end plate 22. As stated above, the interior surface walls of the portion of the work space at and within these end plates may serve as heat exchangers for transferring heat between working gas in the respective expansion and compression spaces and their associated end plates.

Figure 9:
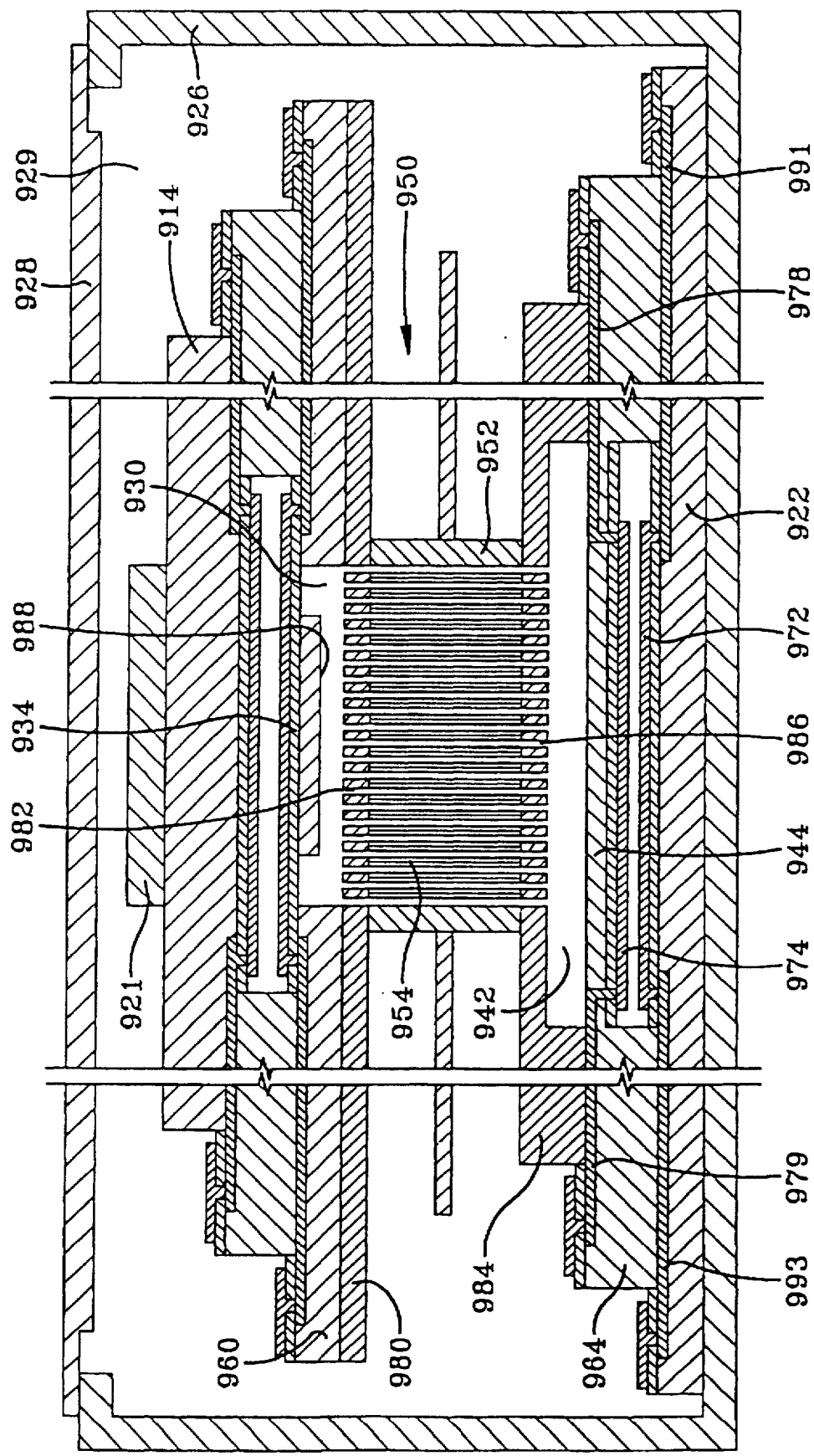
Figure 10:
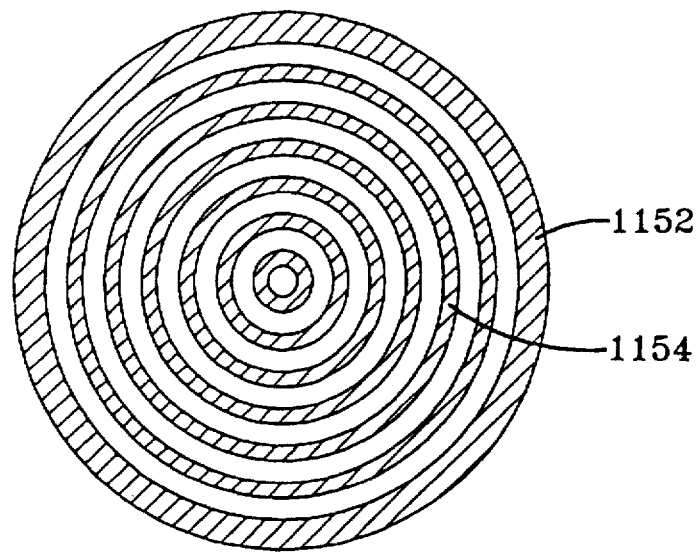
FIGS. 10 and 11 are views similar to those of FIGS. 4 and 5, but illustrating alternative embodiments of the invention.

FIG. 9, however, illustrates an alternative structure with a separate heat exchanger structure. The embodiment of FIG. 9 has an expansion end plate 914 and a compression end plate 922. It also has an expansion diaphragm 934 and compression diaphragm 944, similar to the corresponding parts in FIG. 5. However, a separate, silicon heat exchanger layer 980 is bonded to the silicon layer 960 and is interposed between this silicon layer 960 and the regenerator 950. This heat exchanger layer 980 is provided with a plurality of axial perforations 982 communicating the expansion space 930 with the interior of the regenerator 950. Preferably these perforations are in the form of long slots separated by a series of parallel fins. A similar heat exchanger layer 984 is bonded to the compression end plate layer 964 communicating the interior of the regenerator 950 with the compression space 942. It is also provided with a plurality of transverse perforations 986.

[Diaphragm Alternatives]

Planar processing techniques also permit the silicon diaphragm to be formed in configurations other than the flat sheet configuration, which is illustrated in FIG. 5. FIG. 7, for example, illustrates an expansion diaphragm 734 and compression diaphragm 744, having annular corrugations. The expansion diaphragm 734 has annular corrugations 784 and the compression diaphragm 744 has annular corrugations 786. The corrugations may be formed by etching notches into the diaphragm. These corrugations make the diaphragm's pressure vs. displacement characteristic more nearly linear as is known in the art of constructing the diaphragms used in low pressure sensors, such as barometers.

FIG. 9 illustrates that a boss region of increased mass, such as circular boss 988, may be formed on the diaphragm 934 by planar processing techniques in order for the designer to control the mass of the vibrating diaphragm 934. This will assist the designer in constructing the vibrating diaphragm so that it will vibrate in a resonant mode.

The ratio of diaphragm displacement to the force applied to the diaphragm can be increased by forming the diaphragm so that it is resonant at the operating frequency. As is well known from elementary physics, the natural frequency of oscillation of a mechanical system is a well known function of the oscillating mass and the spring constant of an attached energy storing device, such as a spring, which alternately absorbs and releases energy. The mass of a diaphragm in the embodiment of the invention as well as the resultant spring constant of all springs acting upon the diaphragm can be selected and designed to make the diaphragm resonant at the operating frequency. The mass can be selected by the dimensions of the diaphragm and may be increased by providing a boss, as described above. The springs acting upon the diaphragm are principally the spring resulting from the elasticity of the silicon diaphragm itself, the gas spring resulting from the gas confined in the backspace, and the gas spring resulting from the gas confined in the work space, which gas springs are adjacent to each diaphragm. Consequently, the gas spring, and particularly the backspace volume, may be designed so that the diaphragm has a natural frequency of oscillation, i.e. resonance, at the operating frequency. Alternatively, of course, the backspace volume may be so large that it has a negligible spring constant and, as a consequence, the resonant frequency will principally be a function of the spring constants of the work space gas springs and of the silicon diaphragm itself and its mass. If the elasticity of the silicon is used as the principal spring constant, the backspace 10 can entirely be eliminated, such as by venting it to the backspace of an adjacent microrefrigerator unit in which the diaphragms are vibrating out of phase by 180°.

The spring constant of the diaphragm can be reduced by making the diaphragm very thin. The spring constant of the diaphragm can also be manipulated by the designer by forming layers of oxide or metal on it or diffusing other materials into it, and, as a consequence, multilayer diaphragms may also be utilized.

[Diaphragm Actuators]

An electromechanical actuator, forming a part of the control system, is mechanically connected to each of the diaphragms. A broad variety of electromechanical actuators which may be used with the present invention will be apparent to those skilled in the art and may utilize, for example, electrostatic, electromagnetic, piezoelectric or magnetostrictive principles.

FIG. 5 illustrates a piezoelectric actuator 45 which is operated by an electrical signal applied to its conductive leads 47 and 49.

FIG. 5A illustrates this actuator in more detail. It comprises a single or a multiplicity of metal or conducting film electrodes 510, 512 and 514, which are electrically connected together and connected to the conducting lead 49, and another single or a spaced multiplicity of metal or conducting film electrodes 516, 518 and 520, which are on the opposite side of a piezoelectric layer 522, such as zinc oxide, and are interconnected together to conductive lead 47. This transducer may be fabricated by forming an insulating oxide layer 524 upon the silicon diaphragm 526, then forming the metal or conducting film strips 510, 512 and 514 by conventional techniques, then depositing a zinc oxide or other piezoelectric layer 522 upon the metal or conducting film strips and the oxide layer 524, then again using conventional techniques to deposit the metal or conducting film strips 516, 518 and 520 upon the piezoelectric layer 522. If desired, a further insulating layer of oxide 528 may be deposited on top to provide a protective barrier and electrical insulation.

In operation, the control system applies a periodic signal, at the frequency of operation, to the leads 47 and 49, thereby inducing a stress in the piezoelectric layer 522 and causing a resulting strain of the piezoelectric layer 522 and with it the motion of the diaphragm 526.

FIGS. 7 and 7A illustrate an actuator which utilizes electrostatic forces by forming capacitors 760 and 762 respectively in association with each of the diaphragms 734 and 744.

FIG. 7A illustrates the capacitor 762 in more detail. It has a capacitor plate 764 fabricated upon an oxide layer 765, which is deposited upon the diaphragm 734 and connected to an electrical conducting lead 766, shown in FIG. 7A. It also has a second capacitor plate 767, similarly fabricated upon an insulating oxide layer 768, deposited upon the end plate 769 and electrically connected to an electrically conducting lead 770.

The application of a periodic electrical control signal, which alternately charges the capacitor plates 764 and 767 with like charges and opposite charges at the frequency of operation causes periodic forces of attraction for driving the diaphragm 734 in mechanical vibration.

FIG. 9 illustrates yet another alternative actuator for driving the diaphragm 944. It comprises a pair of thin film coils 972 and 974 which are formed as planar, conductive spirals respectively upon the end plate 922 and the diaphragm 944. The planar coil 974 is connected to electrically conducting leads 978 and 979 and the planar coil 972 is connected to electrically conducting leads 991 and 993 for conduction of electrical control currents. While one electrical current may be DC, the other (or each if the first is not DC) is a periodic current at the frequency of operation to provide a time varying magnetic field, alternately attracting and repelling the diaphragm toward and away from the stationary coil 972 to apply the mechanical stress to the diaphragm, causing it to vibrate at the appropriate phase and at the frequency of operation.

[Regenerator Alternatives]

FIG. 7 illustrates a regenerator 750 having a reticulated foam 754 contained within the outer circular, pressure containing vessel wall 752. The reticulated foam 754 has continuously connected, open cell voids or cavities along the entire length of the regenerator, through which the working fluid flows. Such a regenerator may be constructed using techniques currently used in the field of ceramic filters.

Figure 8:
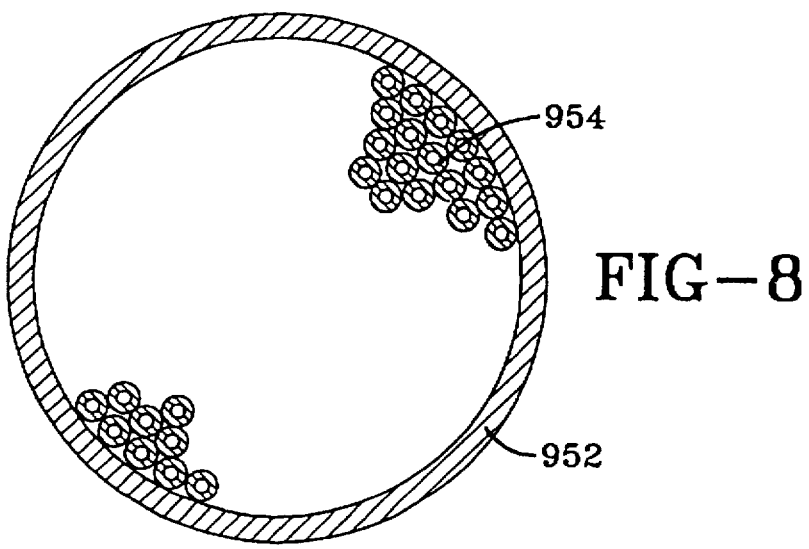
FIGS. 8 and 9 are views similar to those of FIGS. 4 and 5, but illustrating alternative embodiments of the invention.

FIG. 8 and 9 illustrates an alternative regenerator formed by a plurality of parallel tubes 954, contained within the outer, circular, pressure containing vessel wall 952. The regenerator passages consist of both the passages through the center of each tube, as well as the passages between the tubes.

Figure 11:
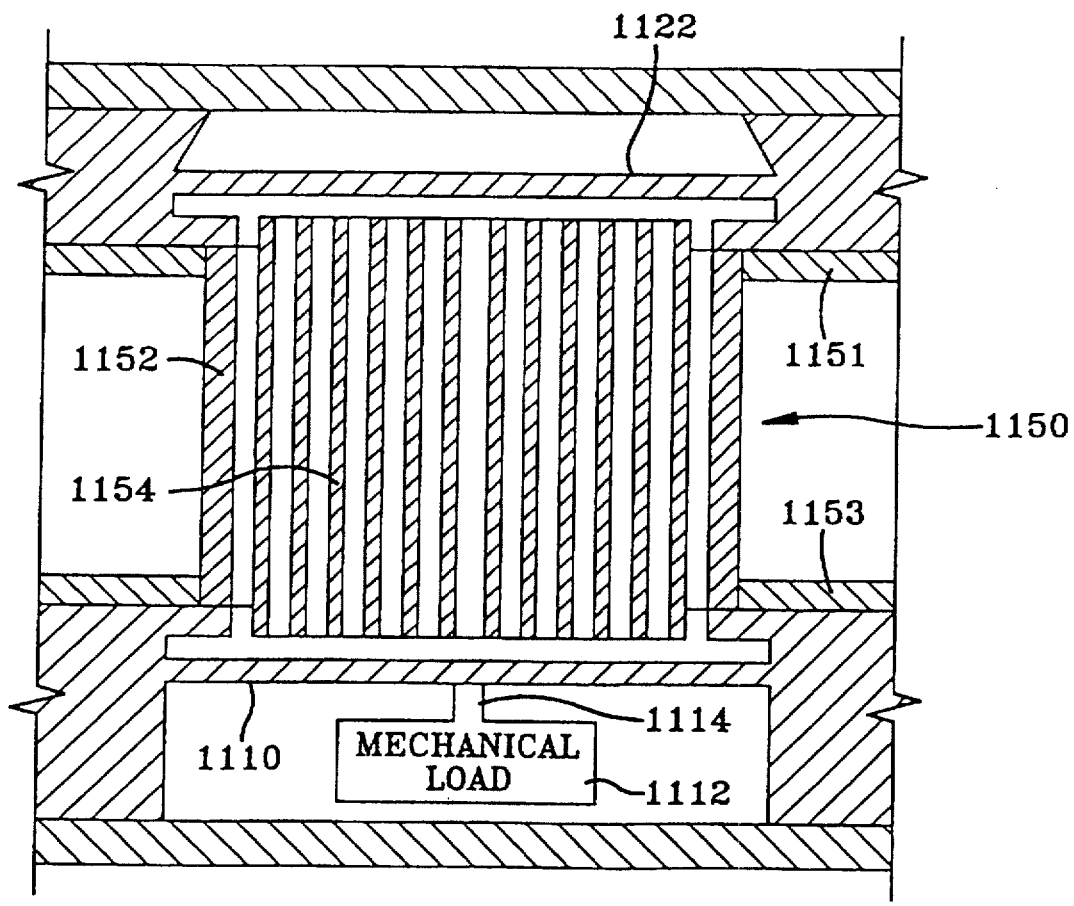

FIG. 11 illustrates yet another alternative regenerator 1150 which comprises a plurality of spaced, concentric tubes 1154 contained within and coaxial with the surrounding circular, pressure vessel wall 1152.

A regenerator may also be formed as a spirally wound, low thermal conductivity, solid film, such as a 3 mil thick glass foil, having projections deformed in the film so that when it is spirally rolled up and wound upon itself, the layers are spaced from each other to provide axial passages.

[Electronic Circuit Alternatives]

From the above description of the invention it can be seen that one of the major advantages of the present invention is that because a Stirling cycle cooler embodying the present invention may be fabricated using planar processing, thin film and other techniques which are commonly utilized in connection with the fabrication of integrated, electronic semi-conductor circuits, coolers embodying the present invention can very conveniently be fabricated so that they are physically and thermally intimately associated with the electronic circuits. The coolers may be fabricated as a part of or an extension of the fabrication of the electronic circuits. Further, these techniques allow hundreds of microrefrigerators to be manufactured simultaneously and in close association with hundreds of electronic integrated circuits. Each electronic circuit is easily and conveniently fabricated so that it is closely, thermally linked to the expansion end plate in order to efficiently pump heat from the electronic device so that the electronic device can be operated at a low, cryogenic temperature. The electronic devices may be integrally fabricated directly into the expansion end plate or in films, discrete components or integrated circuits attached to and thermally linked to the expansion end plate.

Furthermore, a refrigerator compartment, such as illustrated in FIG. 9, may be constructed in association with the end plate 914 by attaching a surrounding wall 926 for containing an electronic circuit 921 or other object to be cooled, and provided with a removable closure 928. This provides an evacuated compartment 929, the contents of which are thermally insulated from the environment, except via the compression end plate 922, for containing and cooling an object, such as electronic circuit 921. The term refrigerator is used to designate operation as a thermal energy pump, pumping heat energy from a lower temperature at the expansion end, to a higher temperature at the compression end. The term refrigerator is not confined to application to a cooled compartment.

[Engine Implementations]

Stirling cycle thermomechanical transducers embodying the present invention can also be designed and operated as an engine to provide mechanical energy to a mechanical load. To accomplish this, a thermal energy source is thermally linked to the expansion end and the control system includes an energy conveying link from the compression end diaphragm to a load. The load must be a part of the control system because the complex load impedance is part of the dynamic system determining the magnitude, phase and frequency of diaphragm vibrations described above.

FIG. 11 illustrates a compression end diaphragm 1110, connected to a mechanical load 1112 through a connecting rod 1114, operating as an energy conveying link. The load 1112 may be, for example, an electrical generator, duplex microrefrigerator or a fluid pump.

The coils in FIG. 9 may be utilized in an embodiment of the invention operated as an engine for the purpose of generating electrical power.

Thermal energy may be applied to expansion end plate 1116 in any of the conventional manners by which thermal energy is applied to Stirling cycle engines including incident solar radiation, combustion, radio-isotope radiation or industrial waste heat.

The present invention affords the opportunity for fabrication of micro engines which can be utilized to efficiently convert the solar or other thermal energy to electrical energy or mechanical energy. Because currently available photocells convert solar radiation energy directly to electrical energy by an opto-electronic process called the photovoltaic effect, they suffer several disadvantages in comparison with the present invention. First, the efficiency of the thermomechanical conversion of energy by Stirling engines is superior to the opto-electronic conversion efficiency of photovoltaic solar cells. In addition, more solar energy is available for conversion by a Stirling engine than by a photocell: while only approximately 25% of the energy in the solar spectrum is within the band of wavelengths that excites a photovoltaic effect, the energy of the entire solar spectrum can be converted to heat for driving the Stirling cycle. Furthermore, with photocells, the amount of energy available for conversion can not be increased by concentrating solar radiation, because that would raise the temperature of the photocell far beyond the very modest temperature at which the necessary electronic properties of semiconductors are lost. In contrast, solar radiation can be concentrated onto the silicon heat acceptor of a Stirling microengine, because it employs the thermomechanical and not the electronic properties of silicon.

[Fabrication Methods]

Embodiments of the present invention are preferably fabricated by adapting current planar integrated circuit fabrication processes to the production of these embodiments. These processes include microlithography, various oxidation, deposition, doping, etching and other techniques employed in the integrated circuit and silicon sensor and actuator industries. The electrical, integrated circuit chip, which is to be cooled to subambient temperatures, can be manufactured as a part of the same wafer as a cryocooler embodying the present invention. The silicon surface of the cryocooler can be the substrate within or upon which the electronic circuit is constructed.

The structures of the present invention lend themselves well also to the fabrication of large numbers of multiple replications upon a single wafer and subsequent separation of the wafer into either individual embodiments or groups of multiple embodiments. For example, embodiments may be constructed by forming a cooperating diaphragm, back space, expansion space and heat exchanger for each of a plurality of spaced apart, heat accepting, fluid expansion ends of a plurality of Stirling transducer pressure vessels. This can be done by etching away selected portions of silicon wafers and then aligning and joining the wafers together in-the-plane as an integral expansion end plate. Similarly, a cooperating diaphragm, back space, compression space and heat exchanger, with each of a plurality of spaced apart, heat ejecting, fluid compression ends of a plurality of Stirling transducer pressure vessels may also be formed by etching away selected portions of silicon wafers and then aligning and joining the wafers together in-the-plane as an integral compression end plate.

A plurality of heat regenerators may be formed and joined together as an integral regenerator plate, each regenerator having fluid openings on opposite sides of the regenerator plate. The openings are spaced apart for registration with the end plates. The regenerator plate is then interposed between, aligned with and bonded to the expansion end plate and the compression end plate, by a technique, such as Mallory bonding described in U.S. Pat. No. 3,397,278, to form a unitary structure comprising a plurality of Stirling cycle thermomechanical transducers. This unitary structure may then be separated into individual transducers or separated into a plurality of arrays of multiple transducers.

One manner for forming the integral regenerator plate is to form a plurality of individual, substantially identical regenerators and then bond the regenerators into holes in one or more of the previously mentioned support plates, the holes being arranged in a parallel, laterally spaced array registered with the end plates. The array of individual regenerators is then mechanically connected together to form the regenerator plate. The regenerator plate is then joined between the two end plates.

[Conclusion]

From the above it is apparent that in embodiments of the present invention the entropy generating processes in oscillatory flow are greatly reduced which allows the embodiment to operate at much higher frequencies than previously thought possible for Stirling machines and thus allowing a tiny machine to have a practical thermal pumping capacity and a very desirable specific capacity. While prior art Stirling cycle machines have probably operated at the conventional lower frequencies with a Wolmersley number below 5, the significance of the relationship between the passage size and the Wolmersley number and between displacement amplitude and Mach number have never been associated with an opportunity to build small, high frequency machines.

The broad concept of the invention is the combination of passages exhibiting a characteristic Wolmersley number below 5 and Mach numbers below 0.1 combined with a frequency of operation above 500 Hz.

Because of the dramatic increase in the thermal conductivity of silicon as temperatures decline, silicon makes an exceptionally desirable material for low temperature heat exchangers and heat conducting components. At the same time, silicon is an ideal substrate material for the attachment or fabrication of silicon chips since there is no difference in thermal coefficient of expansion between the substrate and the chip, which, if there were, would otherwise tend to cause detachment or separation under extreme temperature excursions that occur in a cryocooler. Since silicon is the most common material in which electronic circuits are fabricated, silicon offers the possibility of fabricating circuits into the structure of the microrefrigerator's heat exchanger itself. The circuits fabricated into the cooled end heat exchanger might be the circuits that the machine is designed to cool, or they might be circuits that control the operation of the machine.

The small size and high frequency of this machine allows the machine to operate in near-isothermal conditions, unlike the less energy efficient adiabatic conditions in previous, larger, higher frequency machines.

Improvements

While the definitions of terminology, which is used in this document to describe the preferred and alternative embodiments of the invention, are generally known to those skilled in the art, it is desirable to briefly review and expressly define additional terms which will be used.

In the context of thermomechanical transducers, the term "piston" is used to refer to a reciprocating component across which a pressure difference is supported, whereas the term "displacer" is used to refer to a reciprocating component across which a temperature difference is supported.

Thermomechanical transducers incorporating a regenerator are referred to as regenerative transducers. One type of regenerative transducer is a Stirling cycle transducer. It is well known that the Stirling thermodynamic cycle may be implemented by transducers with various configurations of internal components. In the alpha configuration Stirling cycle transducer, the two internal reciprocating components both contribute substantially to the compression and expansion as well as the displacement of the working fluid. Therefore, these components are known as the compression piston and the expansion piston The frequency, amplitude, and phase of the motions of both these pistons is controlled by either a mechanical linkage or by electromechanical actuators electrically linked to a control circuit apparatus.

By contrast, a beta configuration Stirling cycle transducer employs one piston and one displacer. The beta configuration is especially well suited for use in free-piston Stirling cycle transducers in which the frequency, amplitude, and phase of the piston and displacer motions are controlled by the arrangement of the masses of these components, by the springs connected to them, and by the pressure forces acting upon them. As a result, one advantage of the beta configuration over the alpha configuration is that the beta configuration eliminates at least one electromechanical transducer from the control system.

It is known that a beta configuration Stirling cycle transducer operated to convert thermal energy to the mechanical motion of a piston may be connected to another beta configuration Stirling cycle transducer operated to utilize that motion to pump thermal energy from a lower temperature to a higher temperature. Devices of this type are referred to as duplex Stirling cycle transducers, and they require no electromechanical transducers for energy conversion, although they may employ an electromechanical transducer in an auxiliary starting system.

Another type of regenerative transducer is a Vuilleumier heat pump. Like a duplex Stirling cycle transducer, a Vuilleumier heat pump may also be operated to convert thermal energy, flowing from a high temperature to an intermediate temperature, to pump thermal energy from a low temperature to an intermediate temperature. However, the Vuilleumier heat pump achieves this effect by thermal compression without involving the mechanical motion of a compression piston. Conceptually, therefore, a Vuilleumier heat pump resembles a duplex Stirling cycle transducer without a mechanical compression piston.

In the field of microelectronics, the term "integrated" refers to electrical circuits the component parts of which are constructed as portions of a single mechanical object and which, therefore, do not have to be mechanically connected together such as by soldering after their fabrication in order to perform their function as an electrical circuit. These integrated circuits are fabricated in large numbers simultaneously in a unitary silicon wafer and subsequently separated into individually functional circuit chips. In the field of microsensors and microactuators, the term "integrated" refers to transducers the component parts of which are also constructed as portions of a single mechanical object and which, therefore, which do not have to be mechanically connected together after their fabrication such as by welding or bolting in order to perform their function as a transducer. These integrated transducers are fabricated in large numbers simultaneously in a unitary silicon wafer and subsequently separated into individually functional transducer chips. In the field of microsensors and microactuators, the bonding of wafers together in-the-plane into a laminated structure before the wafers are separated into chips is regarded as part of the integrated transducer fabrication process and not as part of a subsequent process for connecting component parts of a transducer together. Thus, the term "integrated pressure sensor" is used to refer to a chip of glass and silicon which serves the function of a pressure sensor, the component parts of which were fabricated simultaneously with those of many other such transducers in wafers of silicon and glass, which wafers were bonded together before being divided into separate functional transducers.

[STIRLING COOLER]

Figure 18:
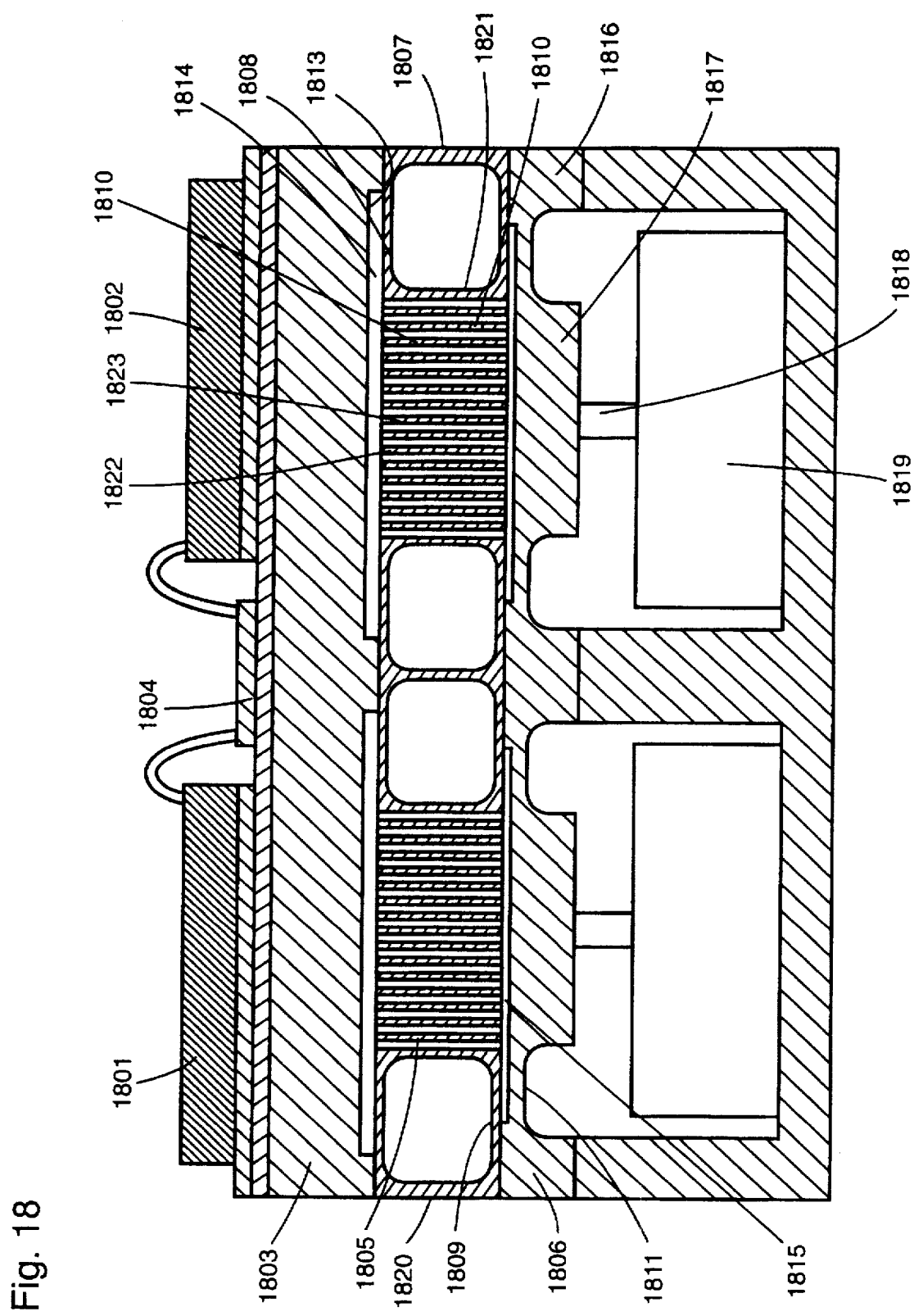
FIG. 18 is a view in axial section illustrating a Stirling cycle transducer embodying the present invention for purposes of cooling electronic and other devices.

FIG. 18 illustrates two electronic devices 1801 and 1802 mounted upon a heat absorbing silicon plate 1803 and having interconnecting, conductors 104 formed on the plate 1803. Constructed beneath the electronic devices are two free-piston Stirling coolers for removing heat from and lowering the temperatures of the electronic devices. Although the figure shows one Stirling cooler associated with each integrated circuit, such one-to-one association is not necessarily required or implied. Each of these coolers, such as the cooler 1805, is a replication of the other and together they are shown arranged in a 1 by 2 array, although they may be fabricated in larger two-dimensional arrays.

Spaced beneath and parallel with the heat absorbing silicon plate 1803 is a heat ejecting silicon plate 1806. Interposed between these plates is the regenerative displacer 1807. The regenerative displacer 1807 includes a heat regenerator 1810 with a perforate matrix in fluid communication with the heat absorbing plate 1803 and heat ejecting plate 1806 at its opposite ends.

The heat absorbing silicon plate 1803, the heat ejecting silicon plate 1806 and the interposed regenerative displacer 1807 form the pressure containing vessel of the Stirling cycle coolers. Each pressure containing vessel defines an enclosed workspace, including fluid passages, and containing a compressible and expansible fluid, typically a gas, all of which are needed for forming a Stirling cycle, thermomechanical transducer.

The plates 1803 and 1806 may each comprise multiple, laminated layers. The structures of the silicon plates 1803 and 1806 and of the regenerative displacer 1807 are preferably formed utilizing planar processing technology of the type utilized in manufacturing electronic integrated circuits and silicon sensors and actuators.

In the preferred embodiment, the heat accepting heat exchanger is the interior wall 1813 which, together with the displacer diaphragm 1808, bounds the expansion space 1814, although alternatives may be used as described below. Similarly, the heat ejecting heat exchanger is the piston diaphragm 1811 which, together with the displacer diaphragm 1809 defines a compression space 1815, although alternatives may be used as described below.

The heat ejecting plate also includes a piston 1816 comprised of a boss 1817 and a flexible diaphragm 1811. To control the frequency and amplitude of the piston, the piston is connected via an energy conveying link 1818 to a motive power means 1819. Examples of such motive power means include electromechanical actuators, such as electromagnetic, electrostatic, and magnetostrictive transducers, as well as thermomechanical transducers such as Stirling, Otto, and Diesel cycle engines. Stirling cycle engines are discussed in more detail below.

Interposed between the heat accepting plate 1803 and the heat ejecting plate 1806 is a regenerative displacer 1807 comprised of a regenerator 1810 supported in place by flexible displacer diaphragms 1808 and 1809 and a plurality of walls 1820 for connecting the regenerative displacer to the spaced heat absorbing and the heat ejecting plates 1803 and 1806. In the preferred embodiment, the regenerator 1810 has a surrounding wall 1821 which substantially contains the working fluid. Within the surrounding wall 1821 is a perforate matrix 1822 in fluid communication with the expansion space 1814 and the compression space 1815.

In the preferred embodiment, the perforate matrix comprises a plurality of spaced, planar walls 1823 connected at their opposite sides to the surrounding wall 1821, although alternative embodiments may be used. Preferably the passages between these walls have an aspect ratio greater than approximately 8.

To reduce the internal conduction of heat between the heat ejecting plate 1806 and the heat accepting plate 1803, it is desirable that the thermal conductivity through the regenerative displacer material along the axial direction between the heat accepting plate 1803 and the heat ejecting plate 1806 be low and that the cross sectional area of this material be small. By contrast, it is desirable for the thermal conductivity of the heat ejecting plate 1806 and of the heat accepting plate to be high in the all directions to reduce temperature drops between heat sources and heat sinks on the one hand and the working fluid on the other. In practice, a thermal conductivity of approximately 1 W/m·K is low enough for regenerative displacer material, and a thermal conductivity of 10 W/m·K is high enough for the material of heat accepting and heat ejecting plates. Silicon dioxide has a low thermal conductivity material for regenerative displacer purposes, having a thermal conductivity of approximately 1.4 W/m·K. Silicon is a high thermal conductivity material for heat accepting and heat ejecting plate purposes, having thermal conductivities ranging from 25 to 1000 W/m·K between temperatures of 1000K and 50K. Another high thermal conductivity material with even higher thermal conductivities in this temperature range is silicon carbide.

Furthermore, it is desirable for the three functional parts of the regenerative displacer (the regenerator, the displacer, and the connecting walls) to be fabricated simultaneously as portions of a single mechanically integrated structure by industrial processes similar to those employed to fabricate the heat accepting and heat ejecting plates of the transducer as mechanically integrated structures. In the improved embodiment of the invention, all these objectives are achieved by anisotropically etching silicon into the three dimensional shape of the unit structure of the regenerative displacer, by oxidizing this unit structure into silicon dioxide which has a thermal conductivity an order of magnitude or more lower than that of silicon, and by bonding these unit structures together into a mechanically integrated regenerative displacer component. These structures for one embodiment of a regenerative displacer are illustrated in greater detail in FIGS. 22 and 23 and are described with reference to those figures.

[CONTROL SYSTEM]

In a beta configuration free-piston Stirling cycle transducer, the masses of the piston and displacer, the springs acting upon the piston and displacer, the areas of various portions of the displacer, and the damping of the motions of the displacer and piston comprise a mechanical control system that controls the proper phase, amplitude, and frequency for the periodic motion of the piston and displacer. The theory of operation and various embodiments for controlling the frequency, phase, and amplitude of the piston and displacer of beta configuration Stirling cycle transducers are taught by the prior art and therefore are not described in detail. Such operation of a beta configuration Stirling transducer operating as an engine, for example, is described by Berchowitz and Redlich ("Linear dynamics of free-piston Stirling engines", Proc Instn Mech Engrs, Vol 199, No A3, pp. 203–213), whereas operation of a beta configuration Stirling transducer operating as a cooler is described by Berchowitz ("Free-piston Stirling coolers", Proc. International Refrigeration Conference—Energy Efficiency and New Refrigerants, Purdue University, Jul. 14–17, 1992).

As the pressure of the working fluid alternates in a beta configuration Stirling transducer, a force equal to the product of the amplitude of the alternating pressure and the area of the piston exposed to the working fluid acts on the piston. The displacer is constructed such that the portion of its area Ad1 exposed to the working fluid in the heat absorbing region of the transducer is greater than the portion of its area Ad2 exposed to the working fluid in the heat ejecting region. A third portion of its area Ad3=Ad1−Ad2 is exposed to a different reference pressure which varies during a cycle much less than does the working fluid pressure. As a result of this arrangement, an alternating force also acts on the displacer in such a way that the common frequency of the alternating motions of the piston and displacer, the ratio of the amplitudes of these motions, and the phase angle between these motions are determined by such factors as Ad3, the spring constant acting on the displacer, the Q of the displacer (i.e., the ratio of the stored displacer energy and the energy dissipated by the displacer each cycle), the undamped natural frequencies of the displacer and piston, and the damping of the displacer motion by various dissipative processes. The spring constant is implemented by exploiting the spring properties of the diaphragm and of the working fluid working as a gas spring.

A representative control system for maintaining the desired phase, amplitude, and frequency of piston and displacer diaphragm vibrations is illustrated in FIG. 18. The mass of the regenerative displacer 1807 and the spring constants of the displacer diaphragms 1808 and 1809 determine its undamped natural frequency. The dissipation of energy by the viscous flow of the working fluid through the regenerator 1810 determines the damping of the displacer motion. Together, this mass, these spring constants, and this damping determine the Q of the displacer. The area of the displacer diaphragm 1808 is greater than the area of the displacer diaphragm 1809, because the diameter between the fixed edges of diaphragm 1808 is larger than the diameter between the fixed edges of diaphragm 1809. The alternating differential pressure between the pressure of the working fluid in the work space and the pressure of the fluid between the displacer diaphragms acts over the difference in the areas of the displacer diaphragms to produce the net force acting on the regenerative displacer. The mass of the piston 1810 and the spring constant of the piston diaphragm 1811 and of the working fluid in the enclosed workspace determine its undamped natural frequency.

In some embodiments, it is convenient for the surrounding wall of the regenerator or for one or more of the displacer diaphragms to contain one or more perforations to enable the working fluid to fill the chambers between the displacer diaphragms, but these perforations must be so small as not to substantially disturb the oscillating flow and pressure of working fluid within the work space during the operation of the transducer. In such embodiments, the interconnecting walls 1820 must contain the working fluid. In alternative embodiments in which the chambers between the displacer diaphragms are not filled with fluid from the work space, the reference pressure in these chambers may be established by means of small or large perforations in the interconnecting walls 1820.

[STIRLING ENGINE]

Stirling cycle thermomechanical transducers embodying the present invention can also be designed and operated as an engine to provide mechanical energy to a mechanical load. To accomplish this, a thermal energy source is thermally linked to the heat absorbing region and the mechanical load is mechanically linked to the piston. The energy dissipating and energy storing effects of the mechanical load are part of the mechanical control system determining the amplitude, phase, and frequency of the motions of the piston and displacer.

Figure 19:
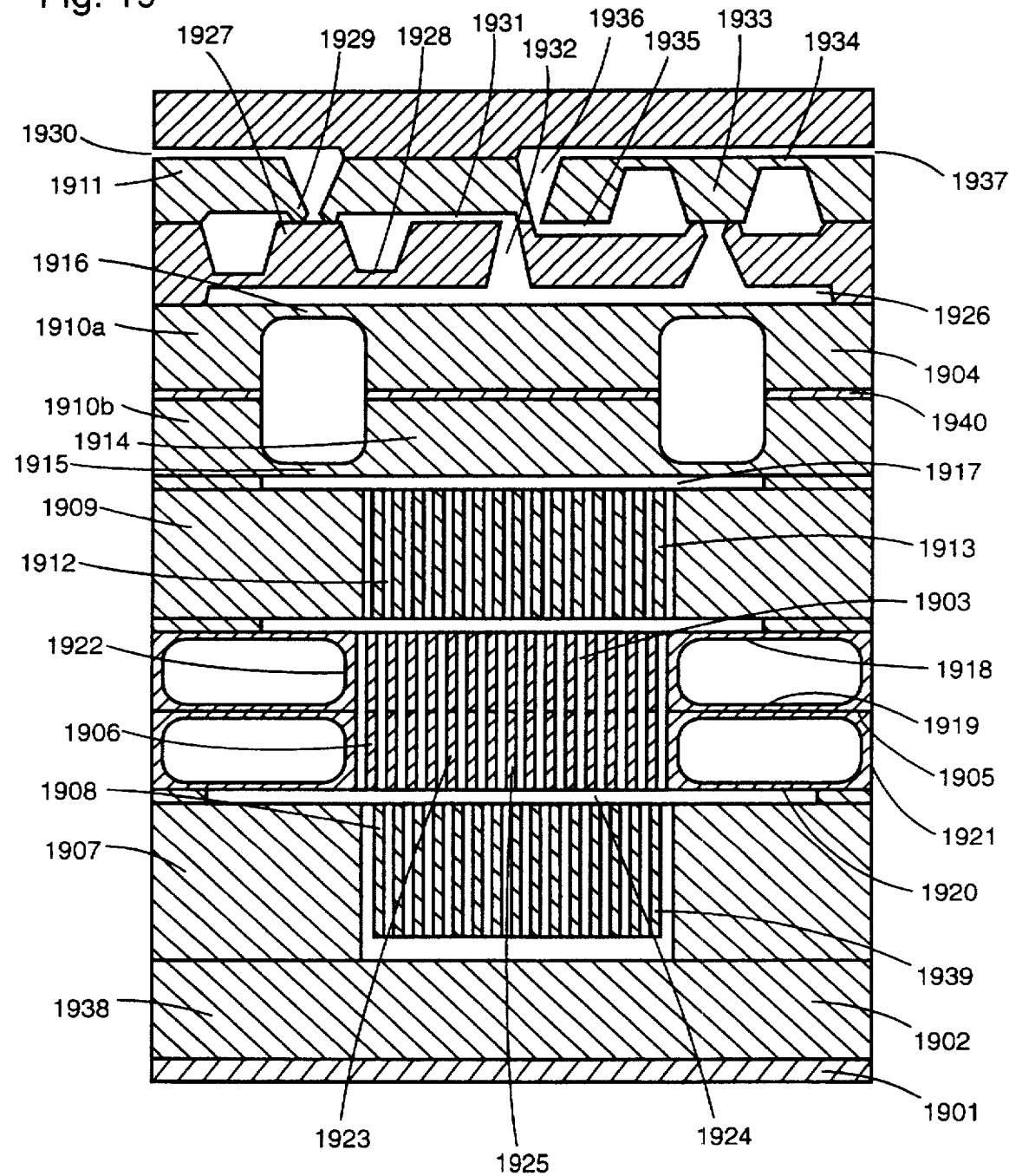
FIG. 19 is a view in axial section illustrating an alternative embodiment of the present invention as a Stirling cycle transducer for purposes of pumping a fluid.

Referring to FIG. 19, thermal energy may be applied to the heat accepting plate 1902 in any of the conventional manners by which thermal energy is applied to Stirling cycle engines, including incident solar radiation, combustion, radio-isotope radiation or industrial waste heat. The heat source illustrated in FIG. 19 is an electrical resistor 1901 thermally linked to the heat accepting silicon plate 1902. Constructed above the heat source is a free-piston Stirling cycle engine 1903 for pumping fluid through an open or closed loop of passages. Although the figure shows one Stirling engine associated with one heat source, such one-to-one association is not necessarily required or implied.

Spaced beneath and parallel with the heat accepting silicon plate 1902 is a heat ejecting silicon plate 1904. Interposed between these plates is the regenerative displacer 1905. The regenerative displacer 1905 includes a heat regenerator 1906 with a perforate matrix in fluid communication with the heat absorbing plate 1902 and heat ejecting plate 1904 at its opposite ends.

The heat absorbing silicon plate 1902, the heat ejecting silicon plate 1904 and the interposed regenerative displacer 1905 form the pressure containing vessel of the Stirling cycle engine. The pressure containing vessel defines an enclosed workspace, including fluid passages, and containing a compressible and expansible fluid, typically a gas, all of which are needed for forming a Stirling cycle, thermo-mechanical transducer.

In the embodiment shown in FIG. 19, the heat accepting plate 1902 includes a heat source substrate layer 1938 and a heat accepting heat exchanger layer 1907 comprised of an extended surface 1908. Preferably, the extended surface 1908 comprises a plurality of spaced, planar walls 1939 connected at their opposite sides to the heat exchanger layer, although alternative embodiments may be used. Preferably the passages between these walls have an aspect ratio greater than approximately 8.

In the embodiment shown in FIG. 19, the heat ejecting plate 1904 includes a heat ejecting heat exchanger layer 1909, two piston layers 1910a and 1910b, and an integral valve head 1911. Like the heat accepting heat exchanger layer 1907, the heat ejecting heat exchanger layer 1909 has an extended surface 1912, preferably comprised of a plurality of spaced, planar walls 1913 with the passageways between the walls having an aspect ratio greater than approximately 8. This piston layers 1910a and 1910b comprise a boss 1914 and two flexible diaphragms 1915 and 1916, although other numbers of layers and diaphragms may also be used. The piston diaphragm 1915, together with the heat ejecting heat exchanger layer 1909, bounds the compression space 1917. In the embodiment shown in FIG. 2, the piston layers 1910a and 1910b are joined by means of a metal or glass film. That technique can also be used between other layers.

Interposed between the heat accepting plate 1902 and the heat ejecting plate 1904 is a regenerative displacer 1905 comprised of a regenerator 1903 supported in place by displacer diaphragms 1918, 1919, and 1920 and a plurality of walls 1921 for connecting the regenerative displacer 1905 to the spaced heat absorbing and the heat ejecting plates 1902 and 1904. The regenerator 1903 has a surrounding 1922 wall which contains the working fluid in the preferred embodiment. Within the surrounding wall 1922 is a perforate matrix 1923 in fluid communication with the expansion space 1924 and the compression space 1917. The expansion space 1924 is bounded by the heat accepting heat exchanger layer 1907 and the displacer diaphragm 1920. In the preferred embodiment, the perforate matrix 1923 comprises a plurality of spaced, planar walls 1925 connected at their opposite sides to the surrounding wall 1922, although alternative embodiments may be used. Preferably the passages between these walls have an aspect ratio greater than approximately 8.

In the embodiment shown in FIG. 19, the fluid valve head is an energy conveying link mechanically connecting the piston via the pumped fluid to a mechanical load consisting of the fluid flow through the attached open or closed loop of passages. Integral silicon valves are well known in the silicon actuator industry. The integral valve head 1911 shown in FIG. 19 is comprised of three bonded silicon layers which include inlet and outlet ports, internal passages, and suction and discharge valve components. In operation, as the piston boss 1914 moves away from valve head 1911, the pressure in the fluid pump compression space 1926 declines drawing the suction valve boss 1927 suspended on the flexible suction valve diaphragm 1928 and away from the suction valve seat 1929, allowing fluid to flow through the inlet port 1930, past the suction valve seat, and through other internal passage 1931 and 1932 into the fluid pump compression space 1926. At the same time, declining pressure in the fluid compression space 1926 draws the discharge valve boss 1933 suspended on the discharge valve diaphragm 1934 against the discharge valve seat thereby preventing fluid from flowing from the discharge port 1935 into the fluid pump compression space.

As the piston boss 1914 moves toward from valve head 1911, the pressure in the fluid pump compression space 1926 rises pushing the suction valve boss 1927 against the suction valve seat 1929, preventing fluid in the fluid pump compression space from flowing out the inlet port 1930. At the same time, rising pressure in the fluid compression space 1926 pushes the discharge valve boss 1933 away from the discharge valve seat thereby allowing fluid to flow from the fluid pump compression space past the discharge valve seat, through the internal passages 1935 and 1936 and out the discharge port 1937.

[DUPLEX STIRLING COOLER]

Figure 20:
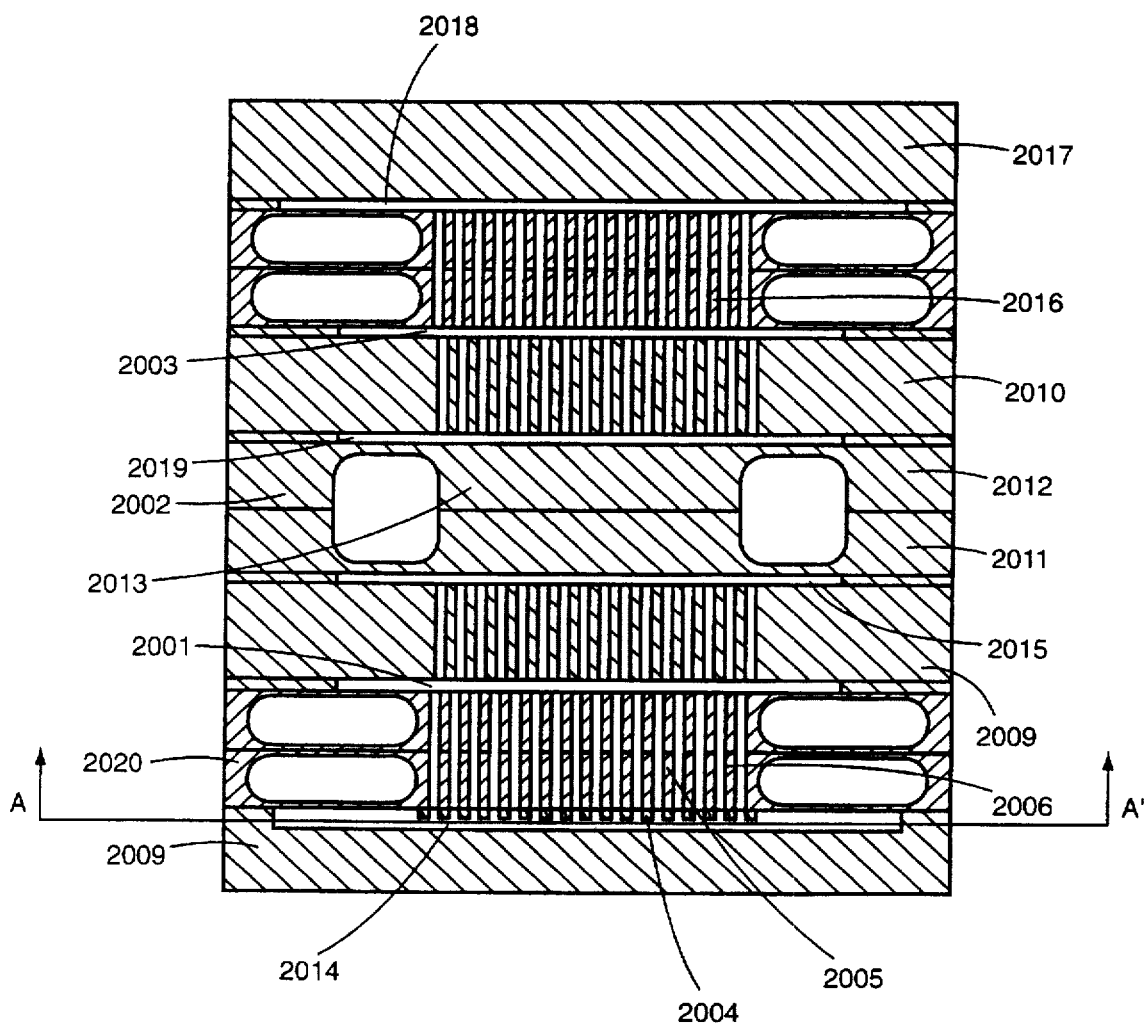
FIG. 20 is a view in axial section illustrating an alternative embodiment of the present invention as a duplex Stirling cycle transducer for purposes of cooling electronic and other devices.

FIG. 20 illustrates one embodiment of a duplex free-piston Stirling cycle transducer in which a common heat ejecting silicon plate 2002 includes two heat ejecting heat exchanger layers 2009 and 2010 and two piston layers 2011 and 2012. Thus, a beta configuration Stirling engine 2001 is mechanically linked via a common piston 2013 to a beta configuration Stirling cooler 2003 to comprise a duplex Stirling cycle transducer without any electromechanical transducers being needed for energy conversion. Establishment of a sufficient temperature difference between the working fluid in the engine expansion space 2014 and the engine compression space 2015 causes the regenerative displacer 2006 of the Stirling engine 2001 and the common piston 2013 to reciprocate. As described above, reciprocation of the common piston 2013 causes the regenerative displacer 2016 of the Stirling cycle cooler 2003 to reciprocate so that heat is absorbed by the heat accepting silicon plate 2017 causing its temperature to decline so that the temperature of the working fluid in the expansion space 2018 of the Stirling cycle cooler is lower than the temperature of the working fluid in the compression space 2019 of the Stirling cycle cooler.

Figure 20A:
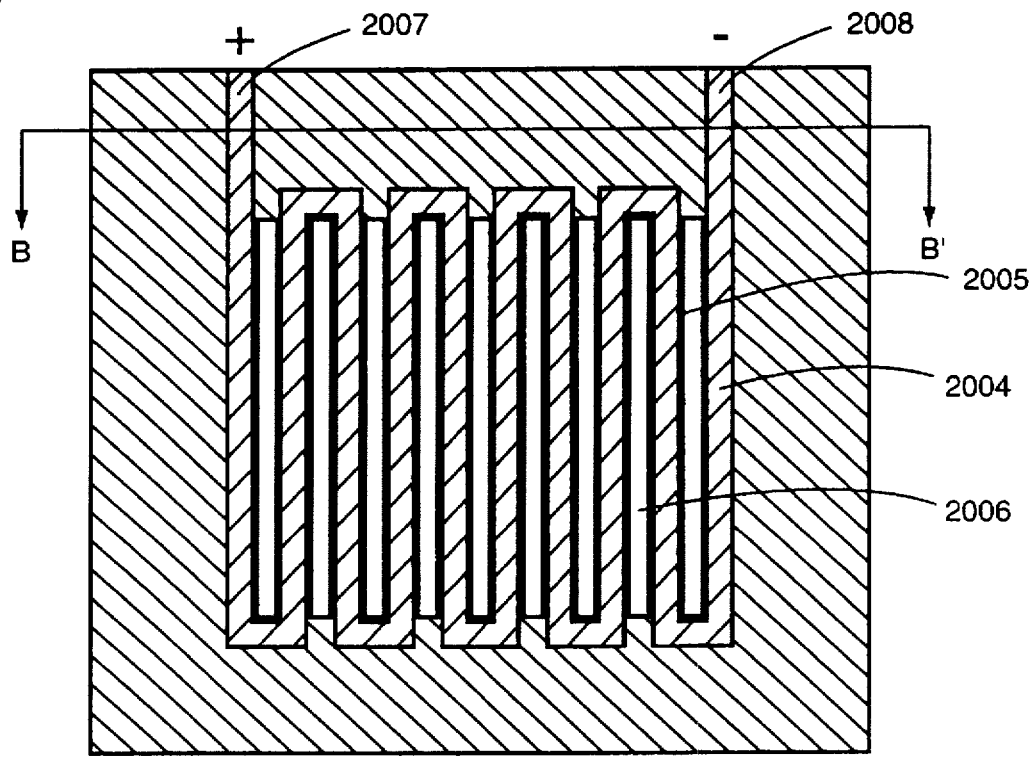
FIG. 20A is a view in cross section taken along the line A-A' of FIG. 20.

The heat source 2004 illustrated in axial section in FIG. 20 is an internal electrical resistor thermally linked to the edges of the regenerator fins 2005 of the Stirling cycle engine's regenerative displacer 2006. FIG. 20A illustrates in plan view through cross section A–A' the electrical resistor 2004 as a ribbon of electrically resistive material distributed between electrical leads 2007 and 2008 along a continuous, meandering path on the edges of the regenerator fins 2005. Other parallel as well as series electrical paths of multiple materials of various electrical conductivities could also be employed. Material properties suitable for the electrical conductors in the hot end of the Stirling cycle engine include high melting point, low thermal diffusion coefficient, and low chemical reactivity. Examples of such materials include refractory metals (such as molybdenum, titanium, tungsten, tantalum, and zirconium), the nitrides, aluminides, and silicides of these metals, and noble metals (such as platinum, rhodium, and niobium).

Figure 20B:
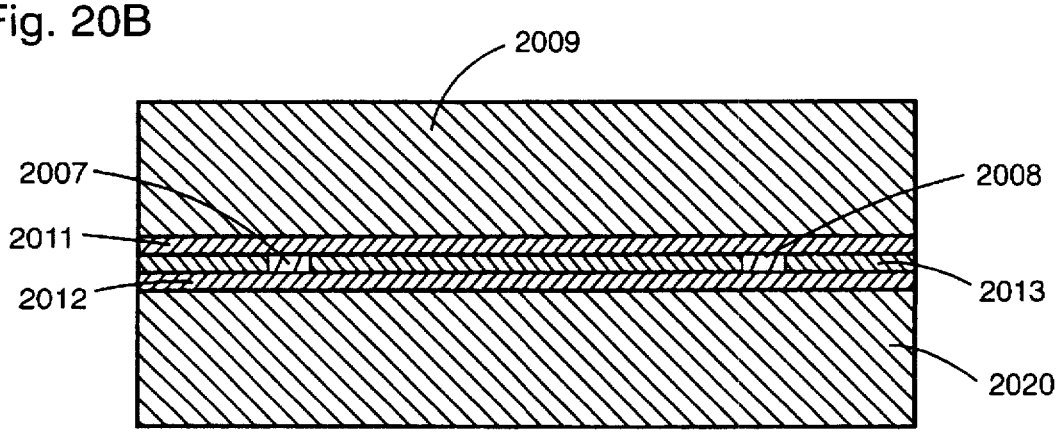
FIG. 20B is a view in vertical section taken along the line B-B' of FIG. 20A.

One means for passing an electrical conductor through the pressure vessel of the Stirling cycle engine is shown in FIG. 20B. In FIG. 20B, the electrical leads 2007 and 2008 are hermetically sealed between thin films of electrically insulating material (such as silicon dioxide, silicon nitride, or high melting point glass). One of these insulating films 2011 is attached to the hot silicon end plate 2009 while another insulating film 2012 is attached to the hot end of the regenerative displacer plate 2020. The insulating film 2013 fills the space between and around the electrical leads 2007 and 2008 to planarize the interface between films 2011 and 2012 to facilitate the establishment of an hermetic seal. We currently believe that a combination of platinum on niobium is preferred, because platinum wires can be used to make electrical connections to the platinum film and because the niobium film can serve as a barrier to diffusion at high temperature due to its low thermal diffusion coefficient.

To facilitate heat transfer from the heat source 2004 to the working fluid, the hot end of the regenerator may not be oxidized, in which case the unoxidized portion of the regenerator would function as an approximately isothermal heat accepting heat exchanger transferring heat unidirectionally from the unoxidized portion of the fins 2005 to the gas, instead of as a regenerator with a strong axial temperature gradient transferring heat bidirectionally depending on the direction of flow of the working fluid.

[VUILLEUMIER HEAT PUMP]

The principles of operation of a Vuilleumier heat pump are well known to those skilled in the art of thermomechanical machines. Like the duplex Stirling cycle transducer, the Vuilleumier heat pump requires no electromechanical transducer for energy conversion. An advantage of the Vuilleumier heat pump over the duplex Stirling cycle transducer in some applications is that the Vuilleumier heat pump produces less vibration due to its elimination of the relatively massive piston of the duplex Stirling cycle transducer. A related disadvantage of the Vuilleumier heat pump compared to the duplex Stirling cycle transducer for other applications is a smaller specific capacity, since the Vuilleumier heat pump does not benefit from the volumetric compression and expansion provided by the piston of the duplex Stirling cycle transducer.

As with Stirling cycle transducers, the frequency, amplitudes and phase of the motions of the reciprocating components (two displacers in this case) in Vuilleumier heat pumps may be controlled either by mechanical linkages and electromechanical transducers or by the masses of the reciprocating components themselves, the springs attached to them, and by the damping and pressure forces arising inside the machine. The operation of the former (kinematic) type of Vuilleumier heat pump has been described by Walker ("Vuilleumier Cryocoolers," in Cryocoolers, Part 1: Fundamentals, Plenum Press, New York, 1983, pp.185–236, especially pp.212–220). The operation of the latter (free-piston) type of Vuilleumier heat pump has been described by Schultz and Thomas ("A linear model of a free-piston Vuilleumier machine compared to experimental results of a prototype," 27th Intersociety Energy Conversion Conference Proceedings, IECEC 1992, San Diego, Calif., Aug. 3–7, 1992, Volume 5, pp. 5.75–5.80.) Schultz and Thomas show that free-piston Vuilleumier heat pumps may achieve stable oscillation without a spring between the casing and the cold displacer, and without a spring between the two displacers, but not without a spring between the hot displacer and the casing unless the casing motion is large compared to that of the displacers.

Figure 21:
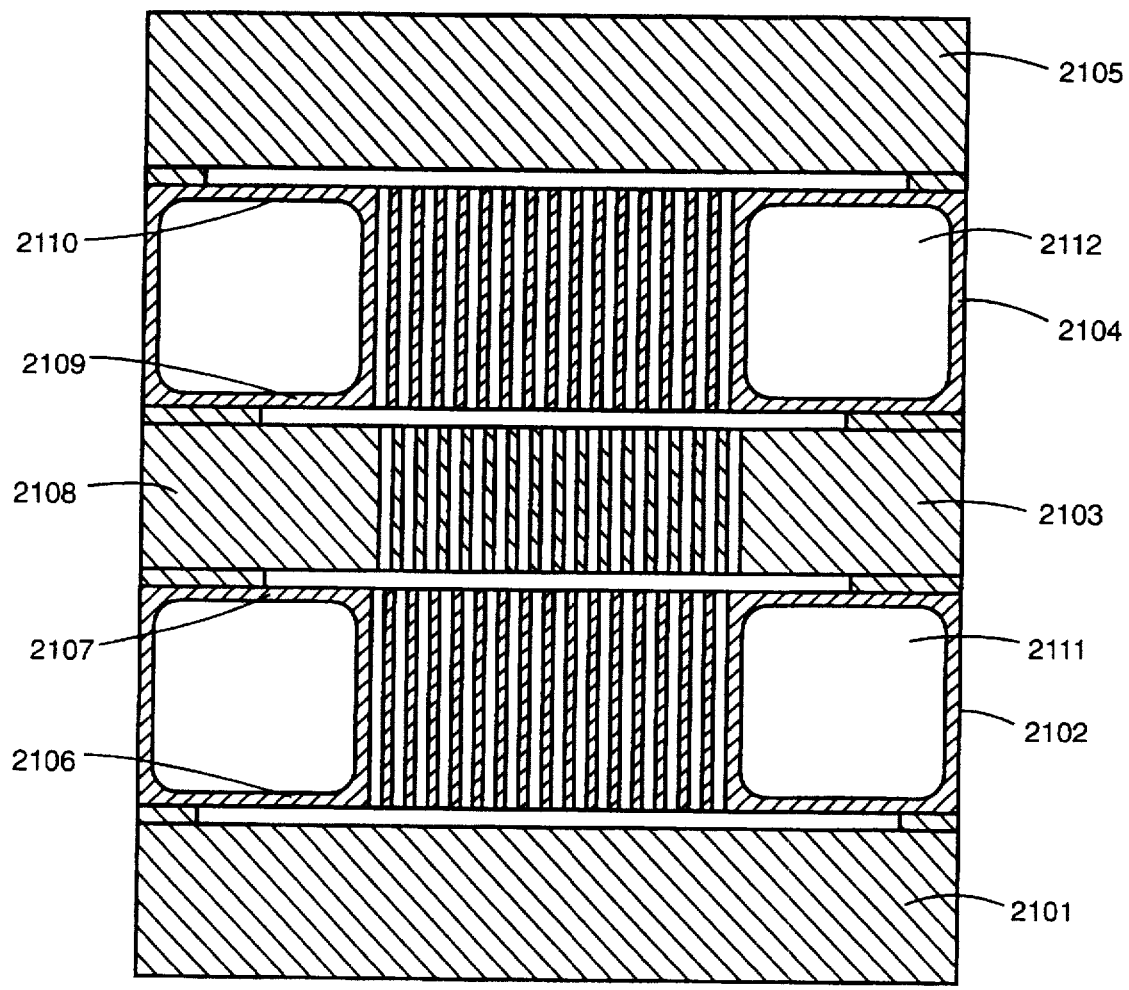
FIG. 21 is a view in axial section illustrating an alternative embodiment of the present invention as a Vuilleumier heat pump for purposes of cooling electronic and other devices.

FIG. 21 illustrates an embodiment of a free-piston Vuilleumier heat pump comprised of a hot heat accepting silicon plate 2101, a hot regenerative displacer plate 2102, a warm heat rejecting silicon plate 2103, a cold regenerative displacer plate 2104, and a cold heat accepting silicon plate 2105. The hot regenerative displacer includes flexible displacer diaphragms 2106 and 2107 which function as springs linking the mass of the hot regenerative displacer to the casing 2108. The casing 2108 includes all the heat accepting and heat rejecting plates as well as the walls of the regenerative displacers that connect these plates together. Similarly, the cold regenerative displacer includes flexible displacer diaphragms 2109 and 2110 which function as springs linking the mass of the cold regenerative displacer to the casing 2108.

As in the Stirling cycle transducers, it is desirable for the thermal conductivity of the regenerative displacers in the axial direction to be minimized and for thermal cross section of this material to be minimized. Also, as in the Stirling cycle transducers, the areas of the displacer diaphragms 2106 and 2110 nearest the heat accepting regions are larger than the areas of the displacer diaphragms 2107 and 2109 nearest the heat ejecting regions in order to provide the required area differentials to create the alternating forces that drive the displacer motions. Also as in the Stirling cycle transducers described above, the reference pressure involved in the control of each regenerative displacer is the pressure of the fluid in the chambers 2111 and 2112 between the displacer diaphragms

[REGENENERATIVE DISPLACER DETAILS]

It is well known that the silicon crystal may be cut into wafers such that a normal vector to the plane of these wafers is in a selected crystallographic direction of the silicon crystal. These crystallographic directions are denoted by their so-called Miller indices which are in the form <XYZ>, wherein X, Y, and Z represent the lengths of vectors in a Cartesian coordinate system aligned with the crystallographic structure. It is also well known that the silicon crystal is anisotropic with respect to many of its properties. That is, these properties have different values in different crystallographic directions. For microelectronic circuit purposes, for example, wafers with their plane normal to one of the <100> family of crystallographic directions are usually preferred due to the values of certain electronic properties of the crystal in that direction. Amongst the anisotropic properties of silicon is he solubility of the silicon crystal in certain chemicals. For example, the silicon crystal etches much faster in the families of <100> and <110> directions in acqueous solutions of potassium hydroxide than in the family of <111> directions. Furthermore, silicon etches much faster in <100> and <110> directions than does silicon dioxide. This chemical anisotropy and selectivity is widely employed to form complicated three-dimensional structures for integrated sensors and actuators.

It is desirable for the regenerator of a microminiature regenerative transducer to be both highly anisotropic in structure (preferably for it to be comprised of a multiplicity of spaced, parallel walls) and for the material of these walls to be low in thermal conductivity. However, the materials that lend themselves to the formation of highly anisotropic structures are crystalline, and crystalline materials have relatively high thermal conductivities. Conversely, because materials with low thermal conductivities are amorphous, they are difficult to form into highly anisotropic structures. The present invention overcomes this difficulty by exploiting the chemical properties of silicon, so that the highly anisotropic structure of the regenerative displacer is formed in an anisotropic silicon wafer, and then the resulting structure is oxidized into amorphous silicon dioxide which has a much lower thermal conductivity.

Figure 22A:
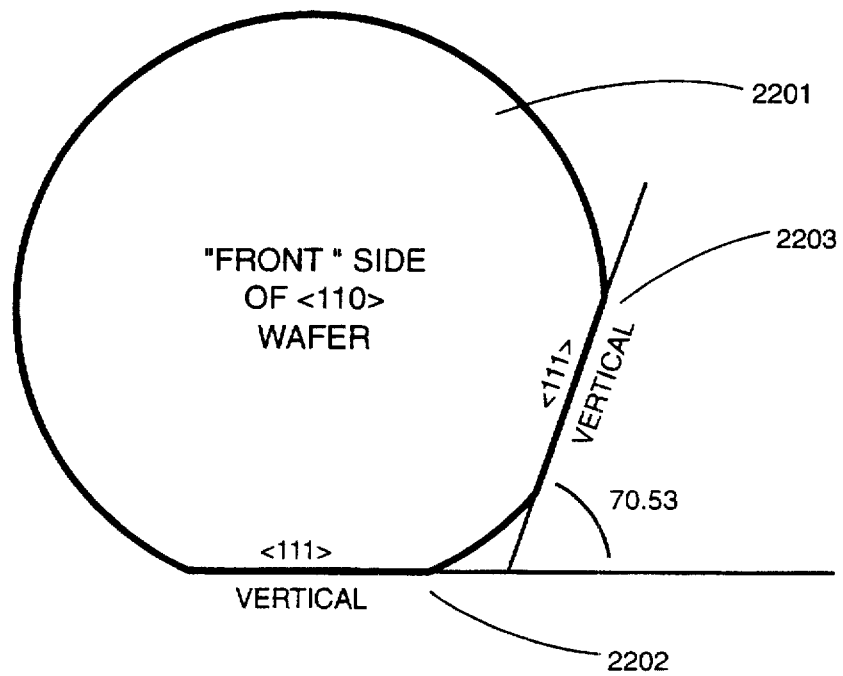
FIG. 22A is a plan view of one side of a <110> silicon wafer.

FIG. 22A illustrates one side of a <110> silicon wafer 2201. The crystallographic orientation of a <110> wafer may be uniquely specified by the location of certain flats 2202 and 2203 polished onto the edge of the wafer. In the embodiment shown in FIG. 22A, the orientation is indicated by flats aligned with <111> planes located 70.53 degrees apart.

Figure 22B:
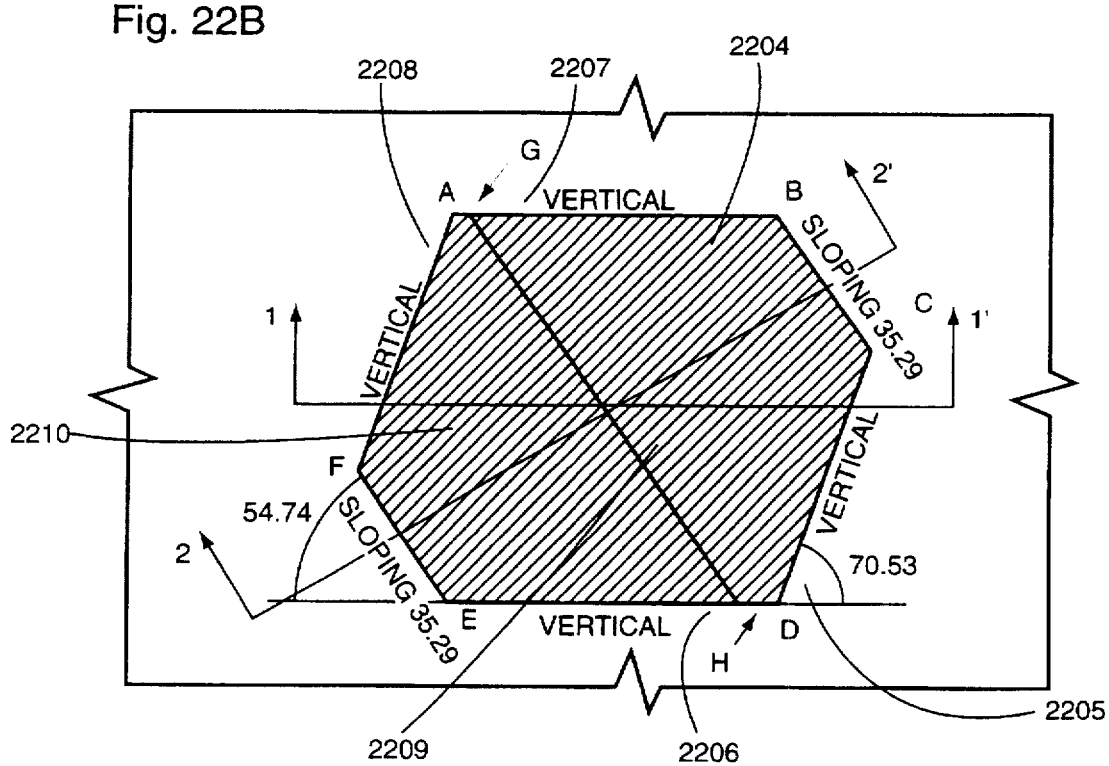
FIG. 22B is a plan view of a cavity anisotropically etched into the side of the wafer shown in FIG. 22A.

FIG. 22B illustrates an expanded plan view of an irregular but symmetric hexagonal cavity 2204 etched through a hole in a silicon dioxide film covering a <110> silicon wafer such as the one shown in FIG. 22A. After sufficient etching time has passed for the etching process to terminate at <111> planes, the cavity 2204 shown in FIG. 22B would result from any and every hole that had edges tangent to the six lines (AB, BC, CD,DE,EF,and FA) where the six <111> planes that constitute the sides of the cavity 2204 intersect the surface of the wafer. Of the six <111> planes, four planes 2205, 2206, 2207, and 2208 are perpendicular to the <110> surface of the wafer and two planes 2209 and 2210 descend from the surface at angles of 35.29 degrees. The two sloping planes 2209 and 2210 meet in the line GH at the bottom of the cavity and are bounded by the perpendicular <111> planes. In general, the points G and H are not at the bottom of the vertical lines descending from points A and D, respectively, where the vertical <111> planes 2205 and 2206 and the vertical <111> planes 2207 and 2208, respectively, meet.

Figure 22C:
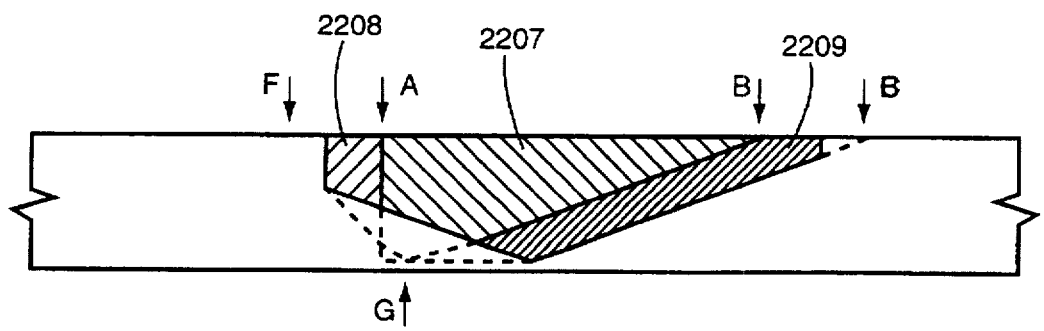
FIG. 22C is a vertical section taken along the line 1-1' of FIG. 22B.
Figure 22D:
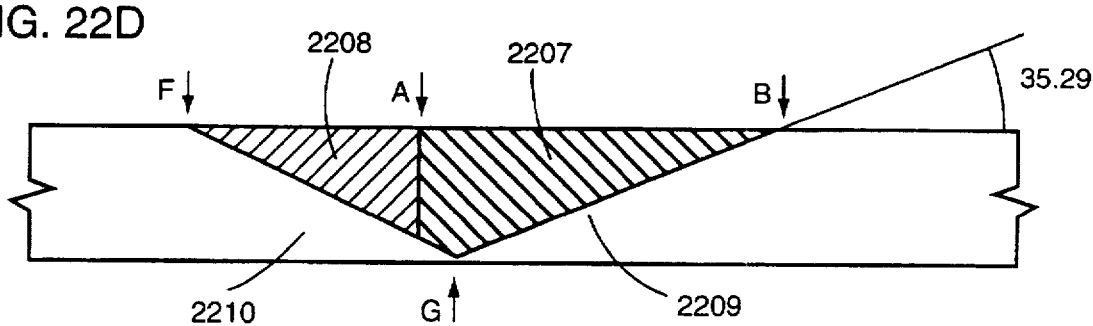
FIG. 22D is a vertical section taken along the line 2-2' of FIG. 22B.
Figure 22E:
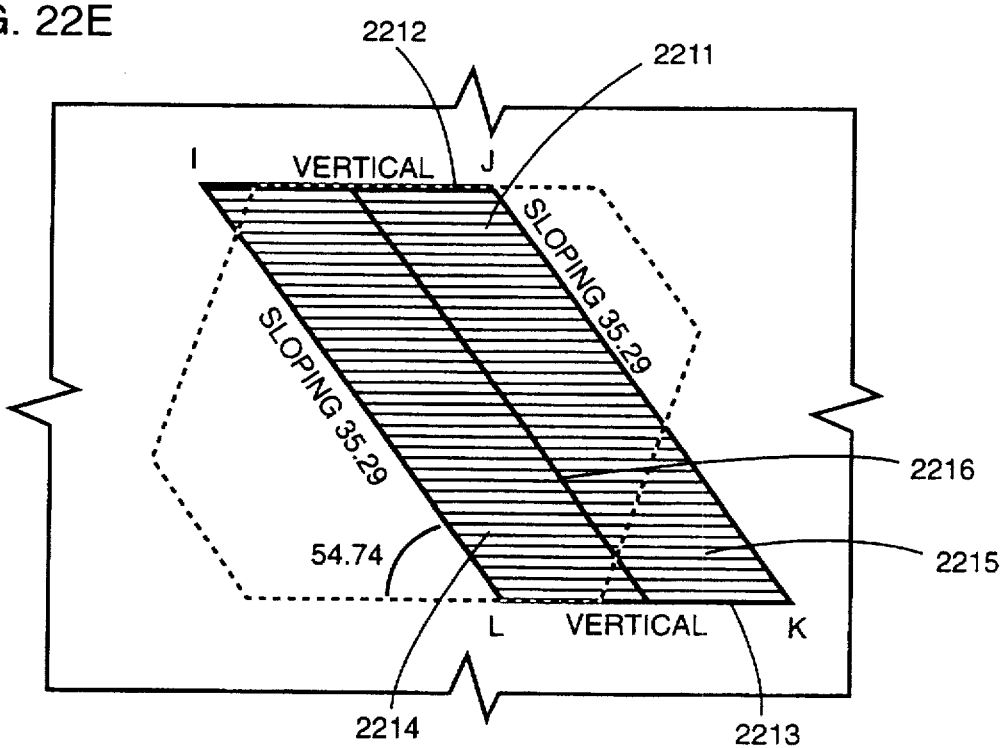
FIG. 22E is a plan view of another cavity anisotropically etched into the side of the wafer shown in FIG. 22A.
Figure 22F:
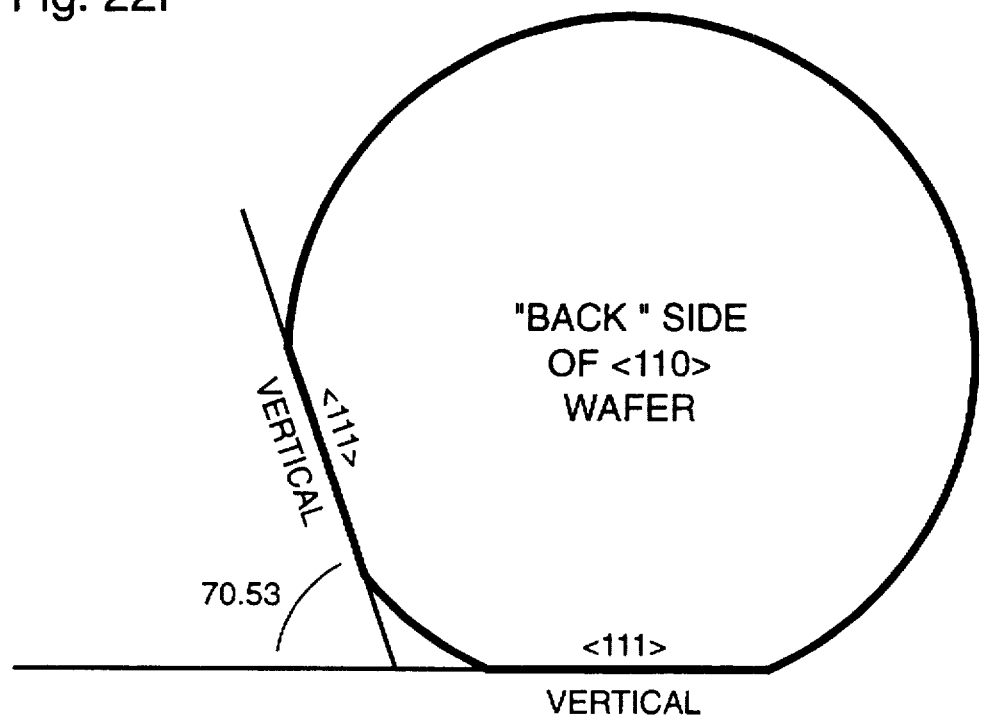
FIG. 22F is a plan view of the other side of the <110> silicon wafer shown in FIG. 22A.
Figure 22G:
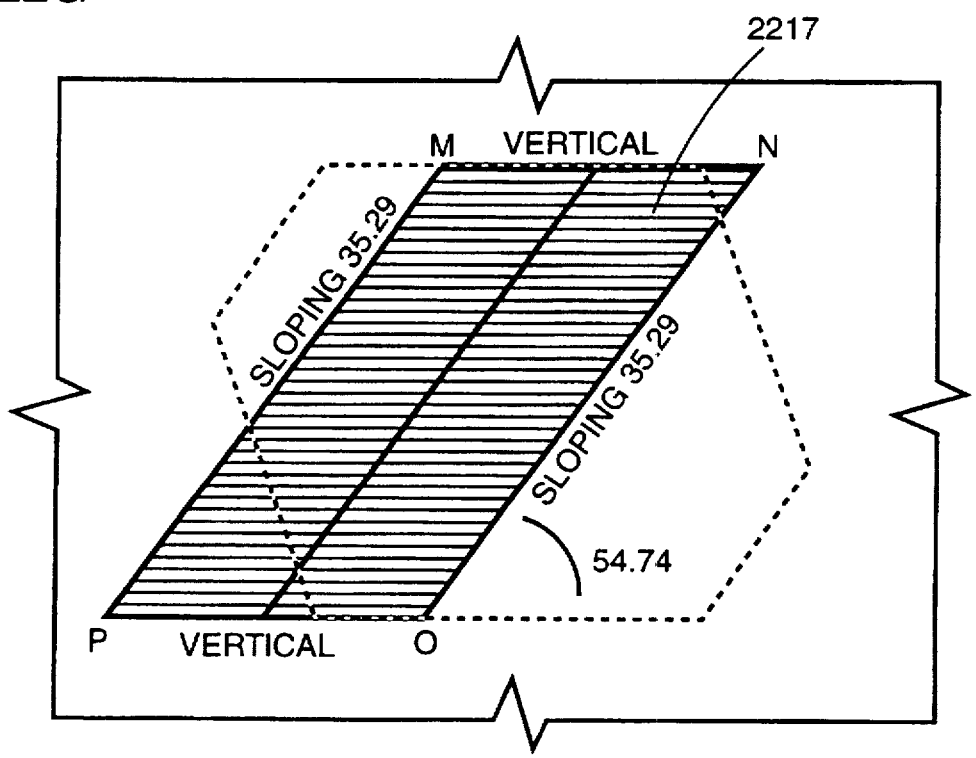
FIG. 22G a plan view of a cavity anisotropically etched into the side of the wafer shown in FIG. 22F.
Figure 22H:
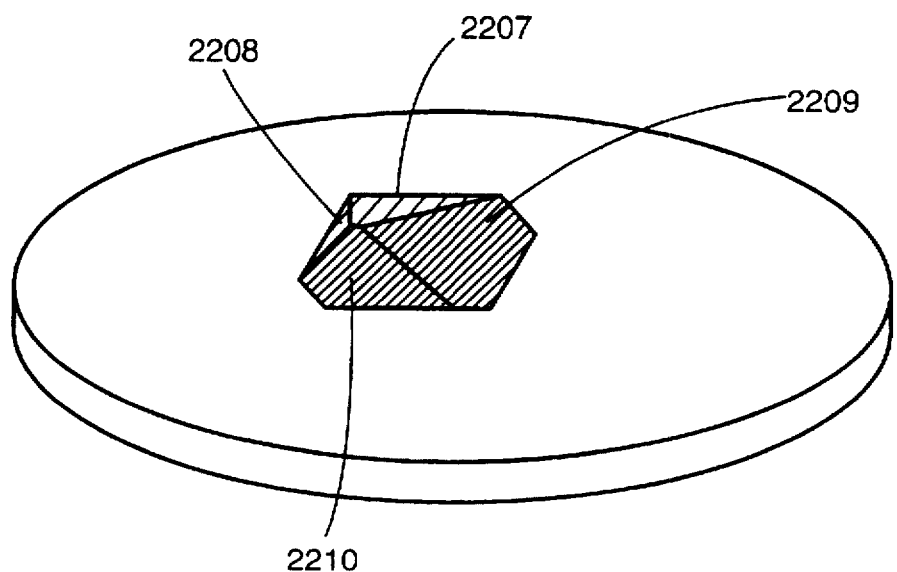
FIG. 22H is an oblique view of the cavity shown in FIG. 22B.

FIG. 22H shows the hexagonal cavity 2204 in silicon wafer 2201 in oblique view. Vertical sides 2207 and 2208 and the sloping planes 2209 and 2210 are visible in this view.

FIG. 22C is a vertical section taken through the line 1–1' in FIG. 22B showing portions of the vertical <111> plane 2207 descending from line AB and the vertical plane 2208 descending from line FA in FIG. 5B and a portion of the sloping <111> plane 2209 descending from line BC in FIG. 22B. FIG. 22D is a vertical section taken through the line 2–2' in FIG. 22B. Line 2–2' is perpendicular to the line GH along which the sloping <111> planes 2209 and 2210 intersect. FIG. 22D shows the entire vertical <111> plane 2207 descending from the line AB and the entire vertical plane 2208 descending from line FA in FIG. 22B, which planes terminate the V-groove formed by the sloping <111> planes 2209 and 2210 descending from lines BC and EF, respectively, in FIG. 22B.

FIG. 22E illustrates an expanded view of an irregular rhomboidal cavity 2211 of a type that can also be formed in a <110> silicon wafer like the one shown in FIG. 22A. The positions of the six lines in which the hexagonal cavity in FIG. 22B intersect the surface of the wafer are also illustrated for reference. The cavity 2211 may only be formed through a hole in a silicon dioxide film which has sides that are congruent with the four lines IJ, JK, KL, and LI in which the four <111> planes of the rhomboidal cavity intersect the surface of the silicon wafer. Of these four <111> planes, two <111> planes 2212 and 2213 are perpendicular to the surface of the wafer, and two <111> planes 2214 and 2215 descend into the wafer at an angle of 35.29 degrees with respect to the <110> surface of the wafer. The two sloping planes 2214 and 2215 meet in the line 2216 at the bottom of the cavity and are bounded by the perpendicular <111> planes. In general, the vertical <111> planes 2212 and 2213 have the shape of an isosceles triangle.

FIG. 22F illustrates the opposite side of the <110> silicon wafer shown in FIG. 22A. FIG. 22G illustrates an expanded view of an irregular rhomboidal cavity 2217 that is the mirror image of the one shown in FIG. 22E so that if the <110> surface shown in FIG. 22E and the <110> surface shown in FIG. 22G are brought into contact, the points I and N, J and M, K and P, and L and O may be aligned.

Figure 23:
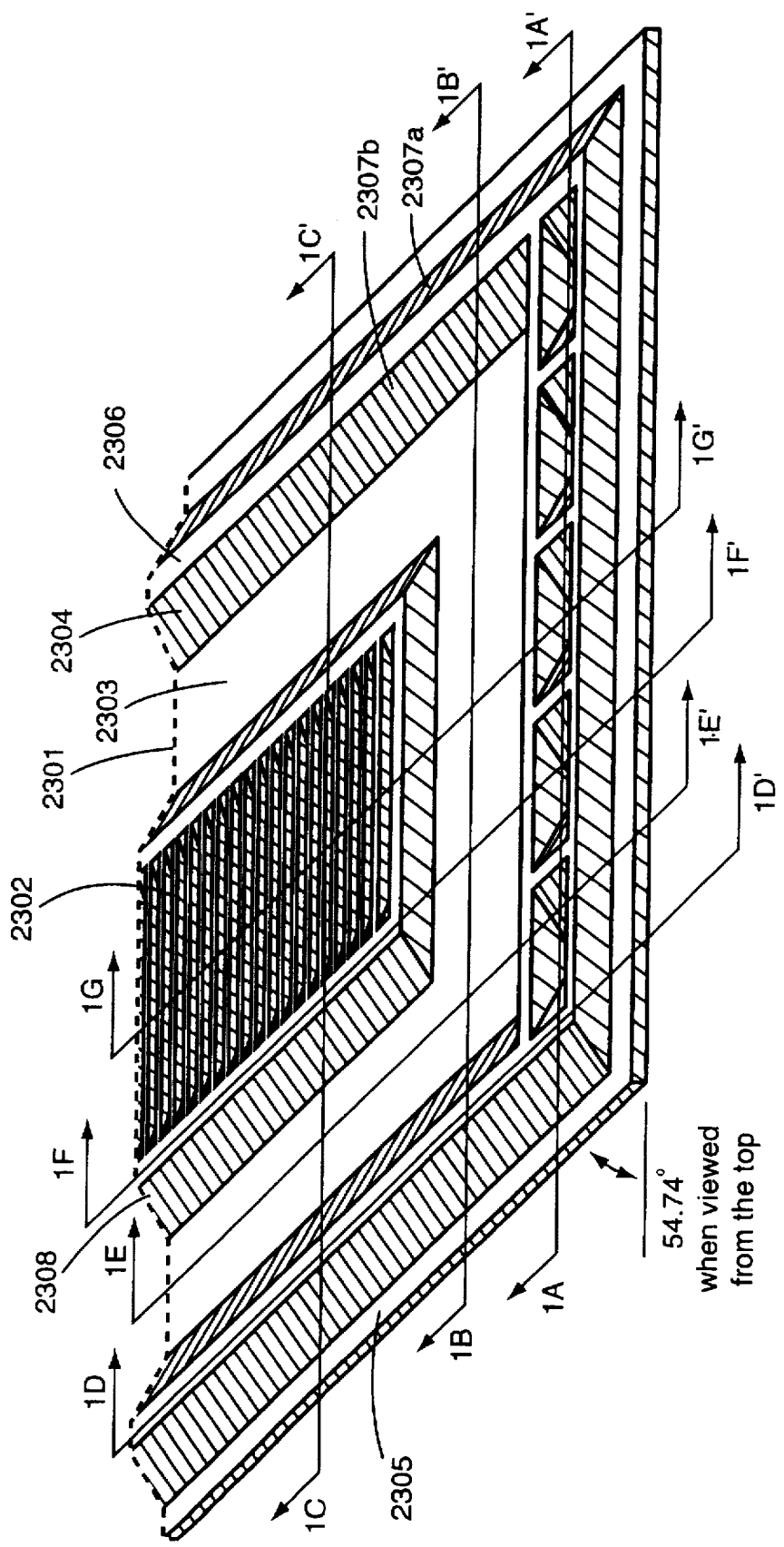
FIG. 23 is a view in perspective of one side of a representative portion of the preferred embodiment of a regenerative displacer chip.
Figure 24:
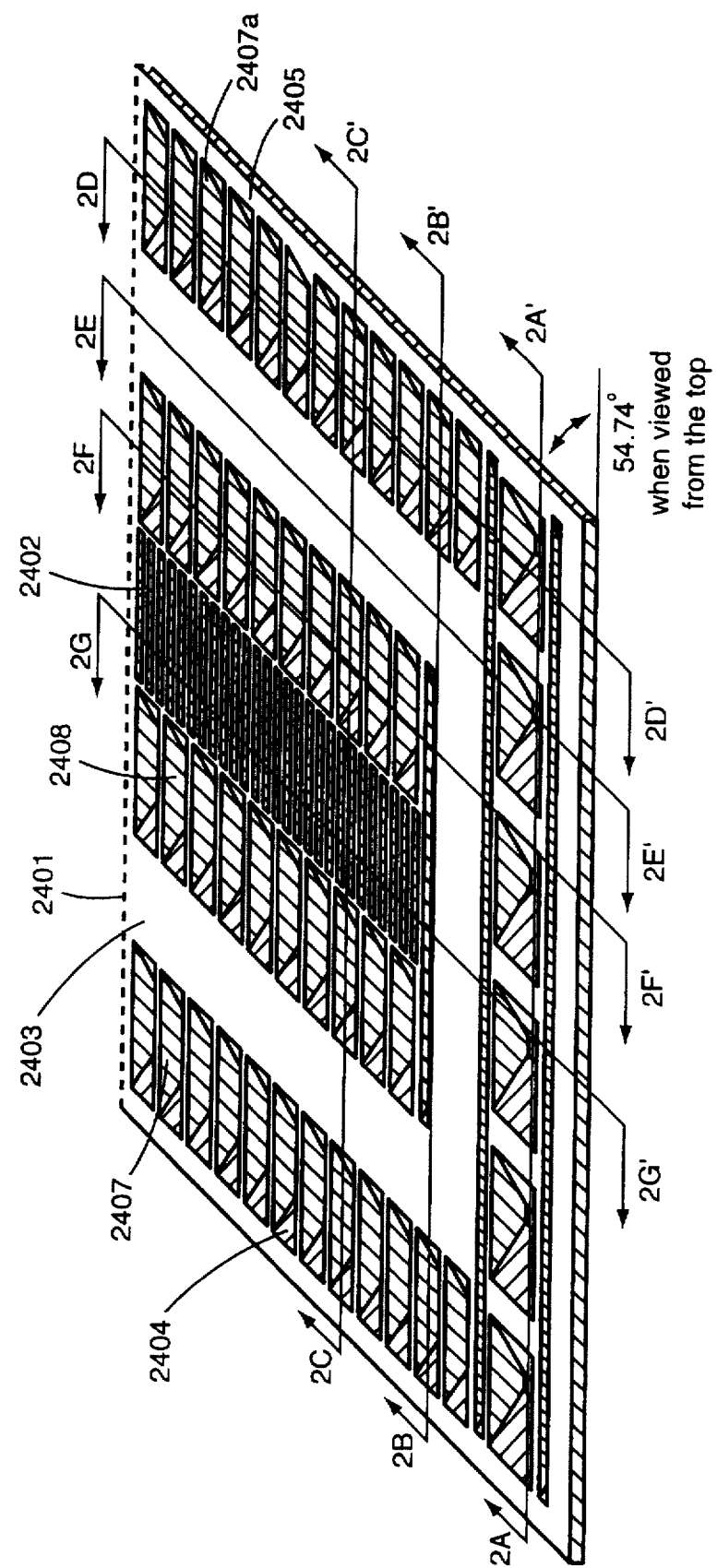
FIG. 24 is a view in perspective of the opposite side of the representative portion of the regenerative displacer chip shown in FIG. 23.

FIG. 23 and FIG. 24 show in perspective the opposite sides of a representative portion of the preferred embodiment of an integrated regenerative displacer chip in a <110> silicon wafer such as the one shown in FIG. 5A and FIG. 5F. The dotted lines 2301 in FIG. 23 and 2401 in FIG. 24 indicate that the chip may be extend an arbitrarily long distance parallel to that line. The chip shown in FIG. 23 and FIG. 24 comprises a regenerator 2302 and 2402 with spaced, parallel walls in <111> planes perpendicular to the <110> silicon wafer in which the chip was fabricated, a displacer diaphragm 2303 and 2403 in a <110> plane parallel to the <110> plane of the wafer in which the chip was fabricated, a reticulated network of walls 2304 and 2404 in <111> planes perpendicular to and sloping at an angle of 35.29 degrees with respect to the <110> surface of the wafer in which the chip was fabricated, and a peripheral extension of the displacer diaphragm 2305 and 2405. In operation, the reticulated network of connecting walls 2304 and 2404 anchor the displacer diaphragm 2303 and 2403 to the rest of the transducer so that working fluid is pumped between the spaced parallel fins of the regenerator 2302 and 2402.

The reticulated network of <111> walls 2304 includes sloping <111> walls 2307a and 2307b that connect the displacer diaphragm 2303 and its extension 2305 to a <110> surface 2306 on the opposite side of the chip. To reduce the thermal cross section of the regenerative displacer in the axial direction perpendicular to the plane of the chip, the silicon that was originally between the sloping <111> walls 2307a and 2307b has been removed to leave only the spaced, parallel, vertical <111> walls 2407. A similar reticulated network of <111> walls 2308 and 2408 reduces the cross sectional area at either side of the regenerator 2302 and 2402.

Figure 25:
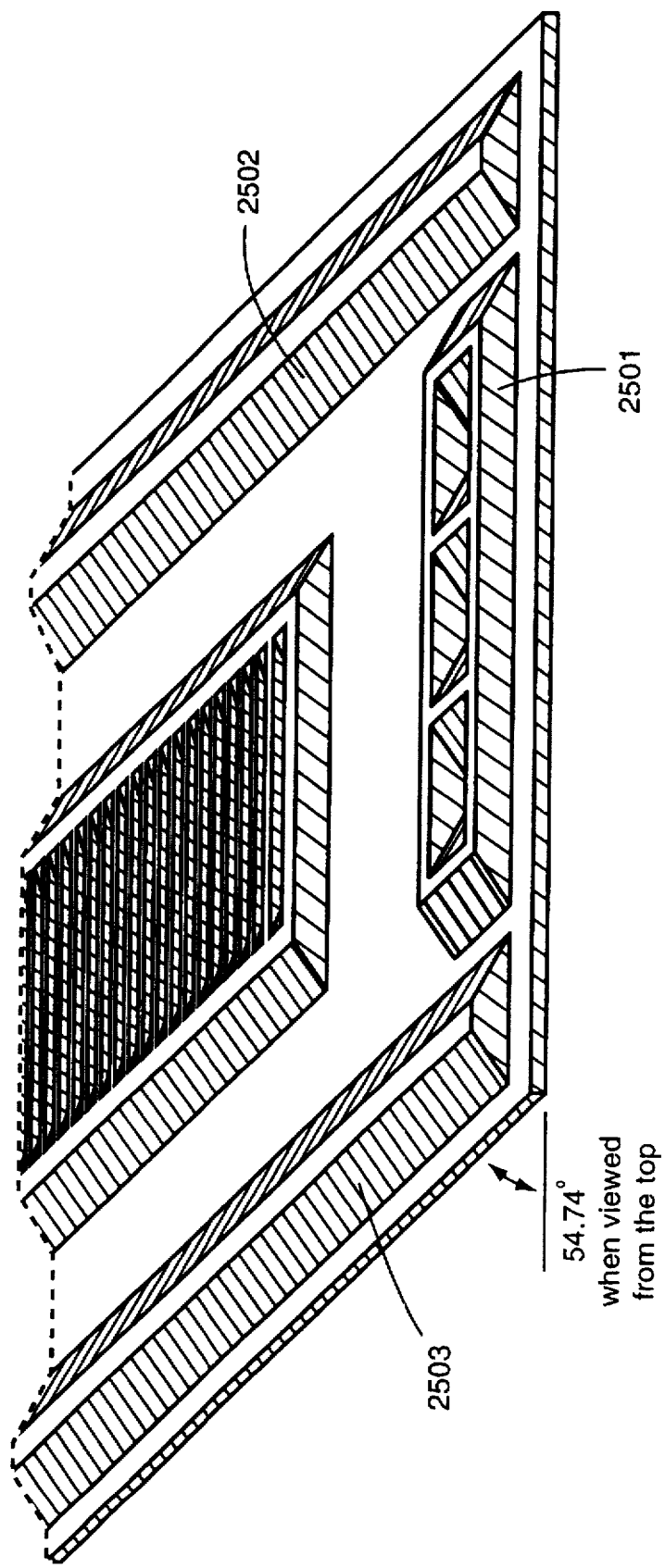
FIG. 25 is a view in perspective of one side of a representative portion of an alternative embodiment of a regenerative displacer chip.
Figure 26:
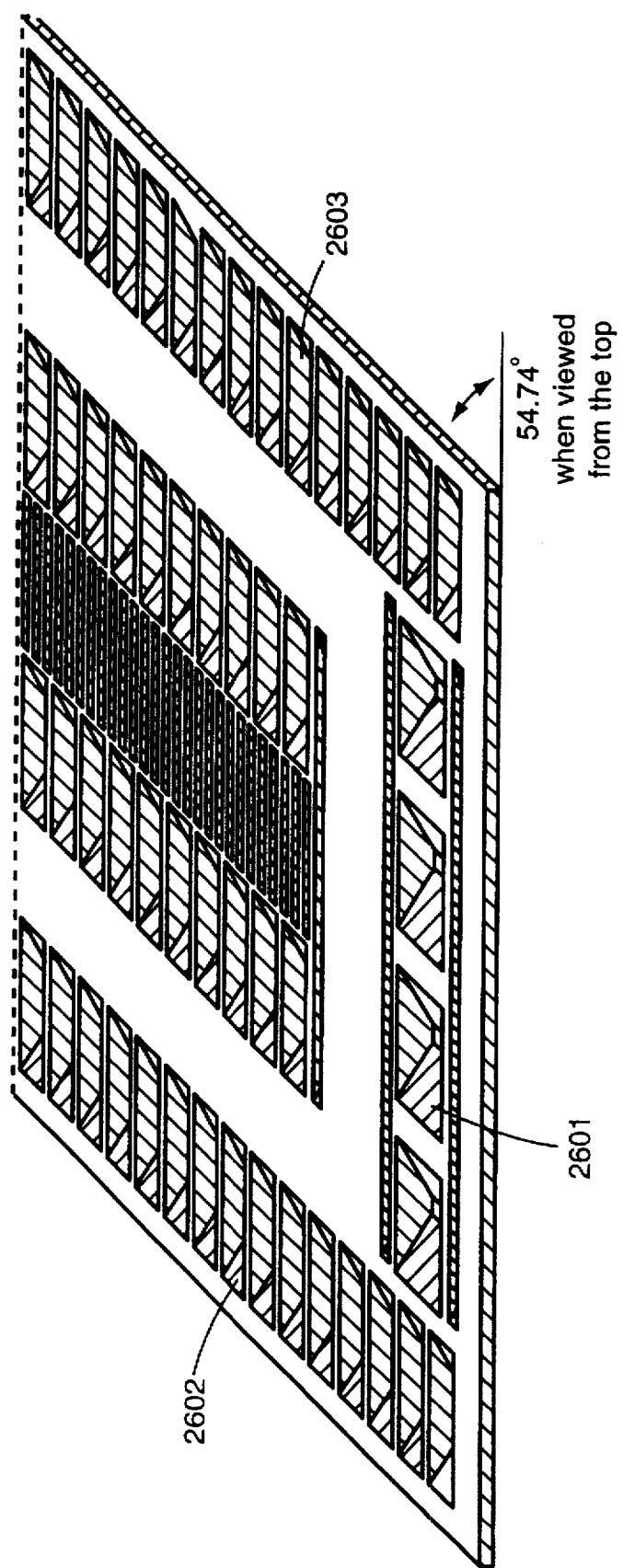
FIG. 26 is a view in perspective of the opposite side of the representative portion of the regenerative displacer chip shown in FIG. 25.

FIG. 25 and FIG. 26 illustrate an alternative embodiment of an integrated regenerative displacer chip. In the embodiment shown in FIG. 25 and FIG. 26, the reticulated network 2501 and 2601 of connecting vertical and sloping <111> walls are not laterally connected to the reticulated network 2502 and 2602 of connecting vertical and sloping <111> walls and the reticulated network 2503 and 2603 of connecting vertical and sloping <111> walls.

Figure 27A:
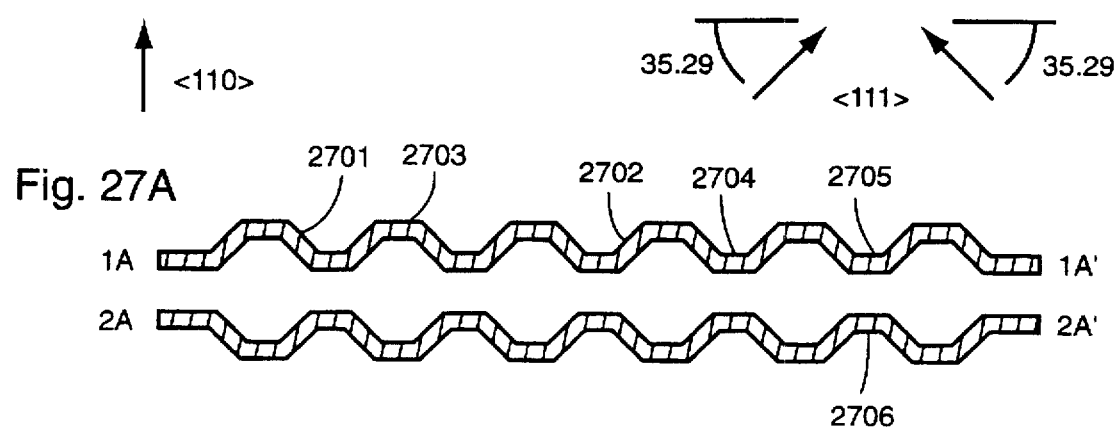
FIG. 27A shows vertical sections taken along the lines 1A-1A' and 2A-2A' of FIG. 24 and FIG. 23, respectively.
Figure 27B:
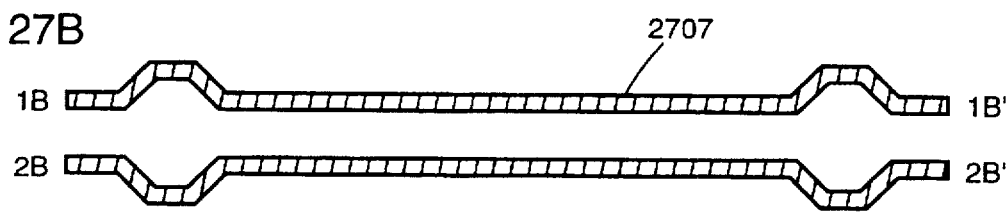
FIG. 27B shows vertical sections taken along the lines 1B-1B' and 2B-2B' of FIG. 24 and FIG. 23, respectively.
Figure 27C:
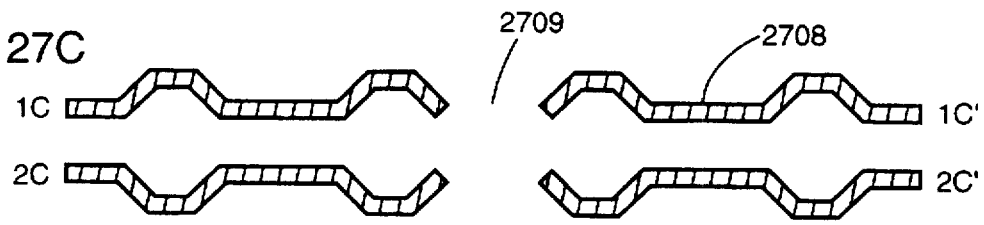
FIG. 27C shows vertical sections taken along the lines 1C-1C' and 2C-2C' of FIG. 24 and FIG. 23, respectively.

FIGS. 27A, 27B, and 27C show vertical sections through the preferred embodiment of the regenerative displacer chip shown in FIG. 23 and FIG. 24, and through a mirror image of such a chip. The regenerative displacer chip and its mirror image may both be formed from opposite sides of <110> silicon wafers by exploiting the symmetric crystallography of silicon described above. The sections shown in FIG. 27A taken through the network of connecting walls illustrate that the sloping <111> planes 2701 and 2702 interconnect <110> surfaces 2703 and 2704 on opposite sides of the chip, and that the resulting <110> surfaces 2705 and 2706 align with one another so that they can be interfaced to one another for bonding.

The sections shown in FIG. 27B are taken through a portion of the displacer diaphragm 2707 laterally spaced from the regenerator, whereas the sections shown in FIG. 27C are taken through the displacer diaphragm 2708 and through one of the spaces 2709 between parallel fins of the regenerator.

Figure 28A:
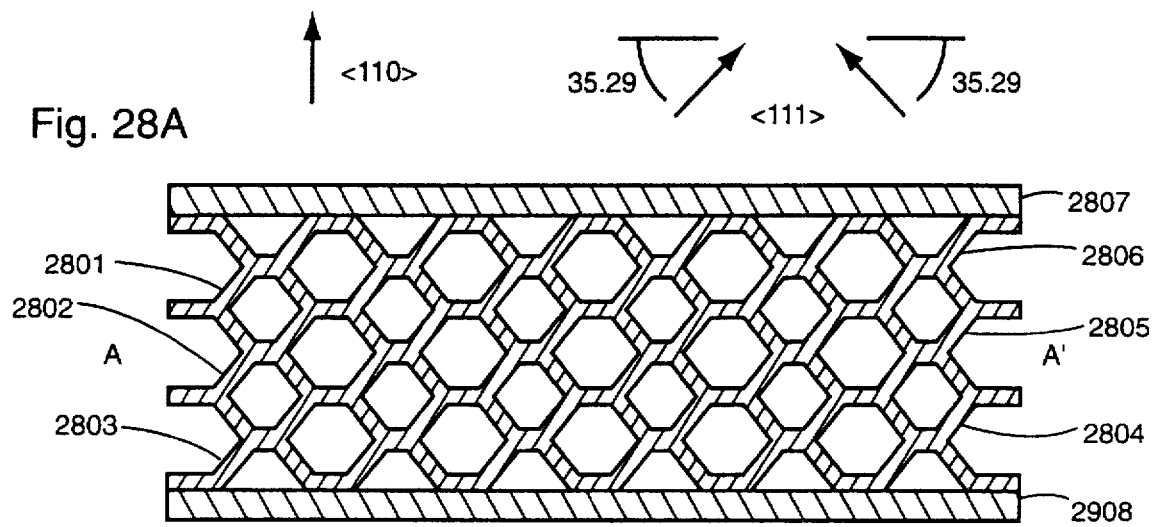
FIG. 28A shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1A-1A' and 2A-2A', respectively.

FIG. 28A shows a vertical section through a regenerative displacer comprised of three regenerative displacer chips 2801, 2802, and 2803 such as the one shown in FIG. 23 and FIG. 24 and three mirror images of such chips 2804, 2805, and 2806 bonded together as a mechanically integrated structure. The section shown in FIG. 28A taken through the reticulated network of connecting <281> walls shows that the resulting structure rigidly connects the regenerative displacer to the adjacent silicon chips 2807 and 2808. Other numbers of regenerative displacer wafers may also be used to comprise a regenerative displacer. Evacuation of some or all of these cells reduces the thermal conductivity of the structure.

Figure 28B:
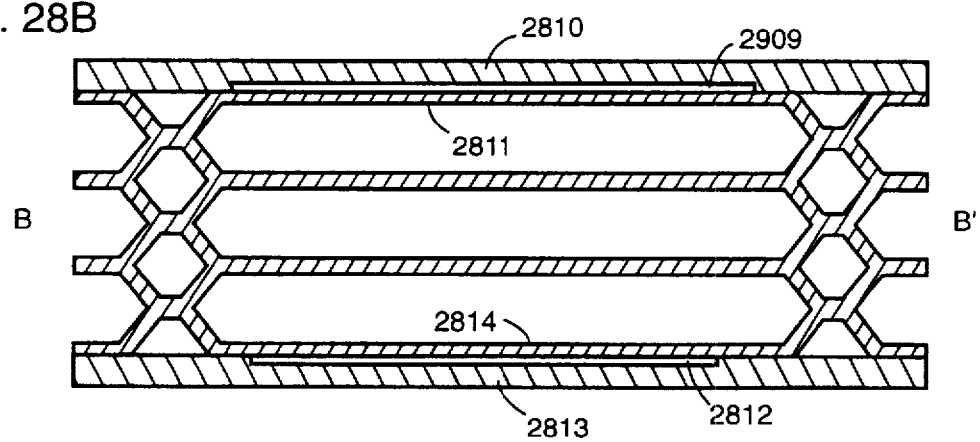
FIG. 28B shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1B-1B' and 2B-2B', respectively.

FIG. 28B shows another vertical section taken through the displacer diaphragm of the preferred embodiment of the regenerative displacer. This section shows the expansion space 2809 of a regenerative thermomechanical transducer bounded by the silicon heat accepting plate 2810 and the displacer diaphragm 2811, and the compression space 2812 of the transducer bounded by the heat rejecting plate 2813 and the displacer diaphragm 2814. The area of the displacer diaphragm 2811 is larger than the area of the displacer diaphragm 2814.

Figure 28C:
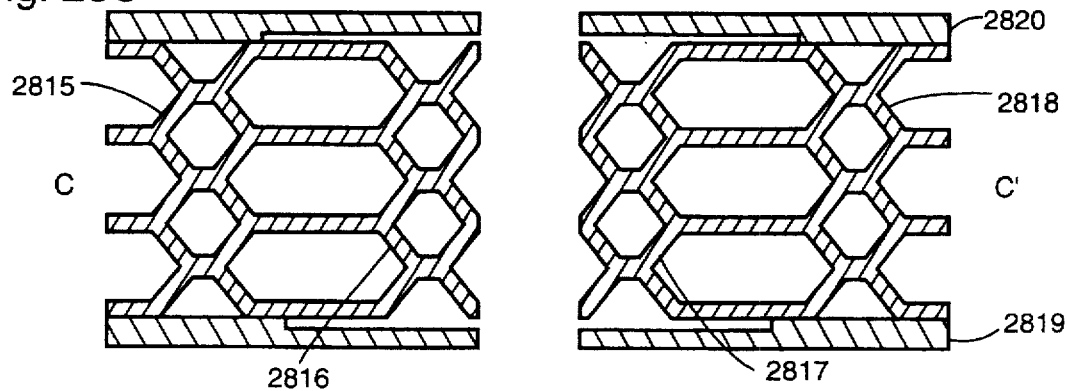
FIG. 28C shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1C-1C' and 2C-2C', respectively.

FIG. 28C shows another vertical section taken through the regenerator and the displacer diaphragm of the preferred embodiment of the regenerative displacer. This section shows four networks of sloping <111> walls 2815, 2816, 2817, and 2818 that constitute part of the thermal conduction pathway between the heat ejecting plate 2819 and the heat accepting plate 2820.

FIGS. 29A, 29B, 29C, and 29D show vertical sections through the preferred embodiment of the regenerative displacer chip shown in FIG. 23 and FIG. 24, and through a mirror image of such a chip. The sections shown in FIG. 29A taken through the network of connecting walls illustrate that the vertical <111> planes 2901 and 2902 interconnect <110> surfaces 2903 and 2904 on opposite sides of the chip, and that the resulting <110> surfaces 2905 and 2906 align with one another so that they can be interfaced to one another for bonding.

Figure 29A:
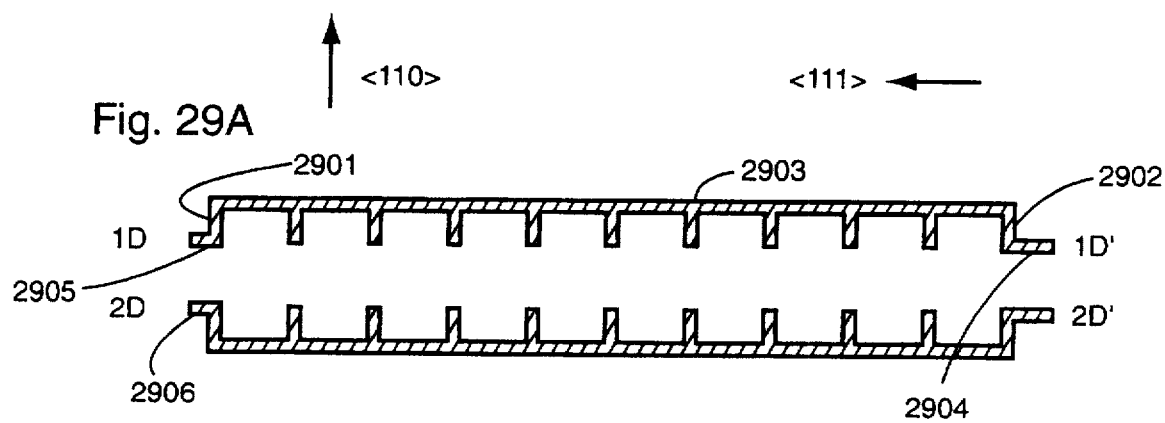
FIG. 29A shows vertical sections taken along the lines 1D-1D' and 2D-2D' of FIG. 24 and FIG. 23, respectively.
Figure 29B:
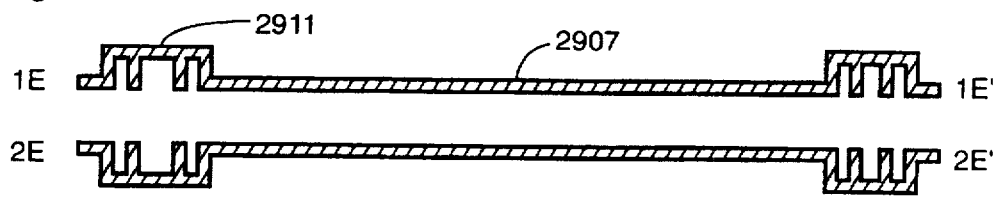
FIG. 29B shows vertical sections taken along the lines 1E-1E' and 2E-2E' of FIG. 24 and FIG. 23, respectively.
Figure 29C:
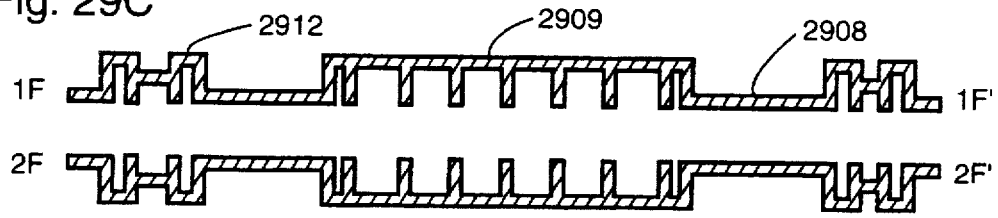
FIG. 29C shows vertical sections taken along the lines 1F-1F' and 2F-2F' of FIG. 24 and FIG. 23, respectively.

The sections shown in FIG. 29B are taken through a portion of the displacer diaphragm 2907 laterally spaced from the regenerator, whereas the sections shown in FIG. 29C are taken through the displacer diaphragm 2908 and through the network of walls 2909 adjacent to the regenerator. The section shown in FIG. 29D is taken through the displacer diaphragm 2909 and through the parallel fins of the regenerator 2910.

Figure 29D:
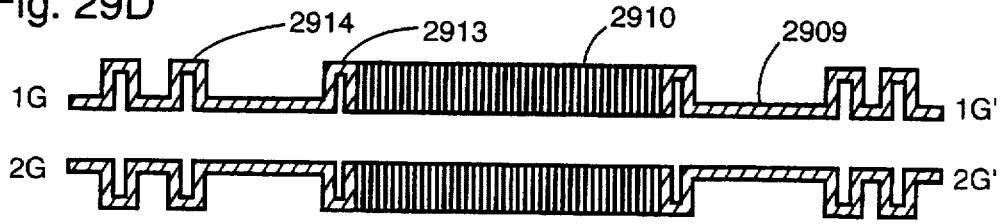
FIG. 29D shows vertical sections taken along the lines 1G-1G' and 2G-2G' of FIG. 24 and FIG. 23, respectively.

The extended <110> planes 2903 in FIG. 29A, 2911 in FIG. 29B, 2909 and 2912 in FIG. 29C, and 2913 and 2914 in FIG. 29D provide planar surfaces for bonding to adjacent wafers.

Figure 30A:
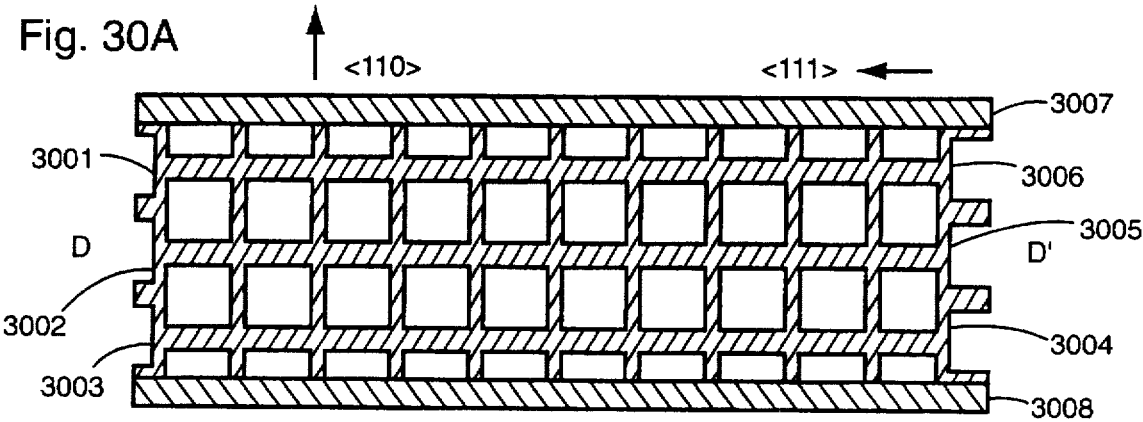
FIG. 30A shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1D-1D' and 2D-2D', respectively.

FIG. 30A shows a vertical section through a regenerative displacer comprised of three regenerative displacer chips 3001, 3002, and 3003 such as the one shown in FIG. 23 and FIG. 24 and three mirror images of such chips 3004, 3005, and 3006 bonded together as a mechanically integrated structure. The section shown in FIG. 30A taken through the network of connecting <111> walls shows that the resulting structure rigidly connects the regenerative displacer to the adjacent silicon chips 3007 and 3008.

Figure 30B:
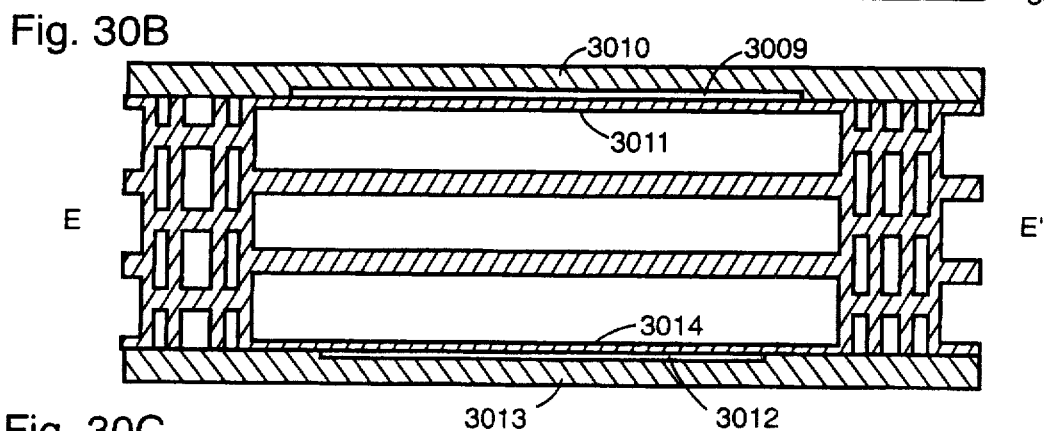
FIG. 30B shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1E-1E' and 2E-2E', respectively.

FIG. 30B shows another vertical section taken through the displacer diaphragm of the preferred embodiment of the regenerative displacer. This section shows the expansion space 3009 of a regenerative thermomechanical transducer bounded by the silicon heat accepting plate 3010 and the displacer diaphragm 3011, and the compression space 3012 of the transducer bounded by the heat rejecting plate 3013 and the displacer diaphragm 3014. The area of the displacer diaphragm 3011 is larger than the area of the displacer diaphragm 3014.

Figure 30C:
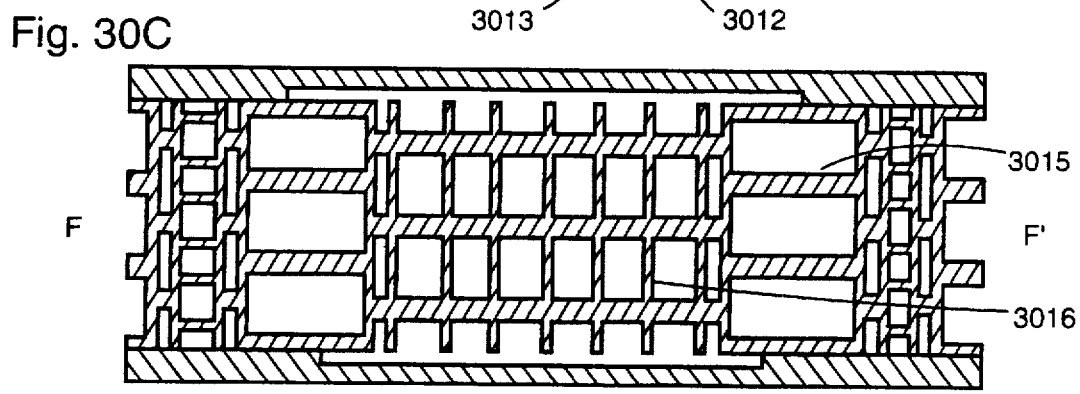
FIG. 30C shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1F-1F' and 2F-2F', respectively.

FIG. 30C shows another vertical section taken through the displacer diaphragm 3015 and the network of walls adjacent to the regenerator 3016.

Figure 30D:
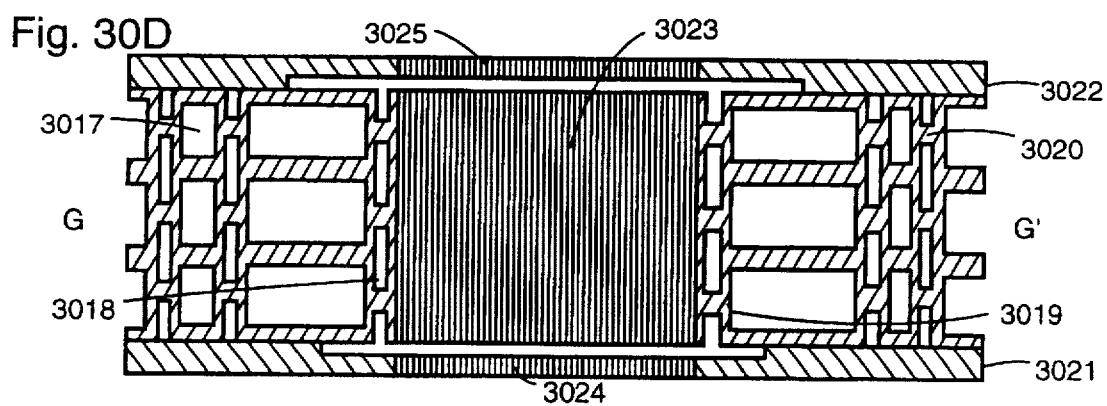
FIG. 30D shows an embodiment of the regenerative displacer formed by bonding together three of the dice shown in FIG. 24 and FIG. 23, respectively, and three dice that are the mirror images of those shown in FIG. 24 and FIG. 23, respectively, in a vertical section taken along the lines 1G–1G' and 2G–2G', respectively.

FIG. 30D shows another vertical section taken through the regenerator and the displacer diaphragm of the preferred embodiment of the regenerative displacer. This section shows four networks of sloping <111> walls 3017, 3018, 3019, and 3020 that constitute part of the thermal conduction pathway between the heat ejecting plate 3021 and the heat accepting plate 3022. FIG. 30D also shows the spaced, parallel fins of the regenerator 3023, of the heat ejecting heat exchanger 3024, and of the heat accepting heat exchanger 3025.

[FABRICATION METHODS]

Embodiments of the present invention are preferably fabricated by adapting current planar integrated circuit fabrication processes to the production of these embodiments. With respect to the regenerative displacer chips, in particular, the integrated structures lend themselves well to the fabrication of large numbers of multiple replications as a unitary structure in a single <110> silicon wafer. For example, embodiments may be formed by forming a heat regenerator, a displacer diaphragm, and a network of connecting walls as an integrated structure by appropriately etching a <110> silicon wafer. Multiplicities of mirror images of these <110> wafers may be aligned, brought into intimate interfacial contact, and bonded together by fusion bonding or by eutectic bonding. The thermal conductivity of the axial thermal conduction pathway in this integrated structure may also be reduced by up to two orders of magnitude by totally oxidizing the axial thermal conduction pathway in a high pressure oxidation furnace. One or more of the resulting bonded regenerative displacer plates may then be bonded in-the-plane by similar means to heat accepting and heat ejecting heat exchanger plates to form a complete Stirling cycle or Vuilleumier transducer. This method has the advantages of forming the regenerative displacer plate of a regenerative thermomechanical transducer from silicon wafers, like the heat accepting and heat ejecting plates, of forming the regenerator, the displacer, and the walls for connecting the transducer plates as an integrated structure rather than as separate components in separate pieces of material that then have to be joined together, and of enabling the axial thermal conductivity of the regenerative displacer structure to be reduced after the structure of the regenerative displacer has been formed.

An hermetic seal for electrical leads to an internal heat source may be produced by oxidizing silicon wafers that are to be joined, by depositing and photolithographically defining electrical conductors on at least one of these wafers, by depositing an electrically insulating material over the metalized surface, by planarizing the resulting surface, and then by aligning the two wafers and bringing them into intimate contact at a high temperature to bond the interfacial surfaces together.

[Conclusion]

From the above it is apparent that in embodiments of the present invention the entropy generating processes in oscillatory flow are greatly reduced which allows the embodiment to operate at much higher frequencies than previously thought possible for regenerative thermomechanical transducers and thus allowing a tiny machine to have practical thermal pumping capacity and very desirable specific capacity. While prior art regenerative thermomechanical transducers have probably operated at the conventional lower frequencies with a Wolmersley number below 5, the significance of the relationship between displacement amplitude and Mach number have never been associated with an opportunity to build small, high frequency machines.

The broad concept of the invention is the combination of passages exhibiting a characteristic Wolmersley number below 5 and Mach numbers below 0.1 combined with a frequency of operation above 500 Hz.

Because of the dramatic increase in the thermal conductivity of silicon as temperatures decline, silicon makes an exceptionally desirable material for low temperature heat exchangers and heat conducting components. At the same time, silicon is an ideal substrate material for the attachment of silicon chips since there is no difference in thermal coefficient of expansion between the substrate and the chip, which, is there were, would otherwise tend to cause detachment or separation under extreme temperature excursions that occur in a cryocooler. Since silicon is the most common material in which electronic circuits are fabricated, silicon offers the possibility of fabricating circuits into the structure of the microrefrigerator's heat exchanger itself. Furthermore, since silicon can be oxidized into silicon dioxide, which has a considerably lower thermal conductivity than silicon, after having been formed into complex structures, silicon is an ideal material for forming regenerative displacers. These regenerative displacers may then be used to implement free-piston thermomechanical transducers that require fewer and in some cases no electromechanical transducers for energy conversion.

The small size and high frequency of this machine allows the machine to operate in near-isothermal conditions, unlike the less energy efficient adiabatic conditions in previous, larger, lower frequency machines.

While certain preferred embodiments of the present invention have been disclosed in detail, it is to be understood that various modifications may be adopted without departing from the spirit of the invention or scope of the following claims.

We claim:

1. An improved thermomechanical transducer having:
   (a) a pressure containing vessel defining an enclosed work space containing fluid passageways and a compressible and expansible fluid and comprising at least one heat accepting region, at least one heat rejecting region, and at least one heat regenerating region interposed between said heat accepting and heat rejecting regions; and
   (b) a displacer which alternately transports the working fluid through the said heat regenerating region between the heat accepting region and the heat rejecting region; wherein the improvement comprises the fluid passageways in the work space being sufficiently narrow to provide a Wolmersley number, which is characteristic of the irreversibilities generated by the oscillatory flow of the working fluid in the work space, below substantially 5 and the amplitude of the oscillatory flow of the working fluid being sufficiently small to provide the working fluid a maximum Mach number below substantially 0.1 at operating frequencies above 500 Hz.

2. A transducer in accordance with claim 1 wherein at least one of said heat accepting and heat rejecting regions of the pressure vessel is an integrated plate comprising a high thermal conductivity material.

3. A transducer in accordance with claim 2 wherein the heat accepting region of the pressure vessel is an integrated plate comprising a high thermal conductivity material and the heat rejecting region of the pressure vessel is a spaced, parallel integrated plate comprising a high thermal conductivity material.

4. A transducer in accordance with claim 3 further including a plurality of said pressure vessels arranged in a parallel two dimensional array, the heat accepting regions of the pressure vessels being integratedly formed as portions of one plate and the heat rejecting regions being integratedly formed as portions of another plate.

5. A transducer in accordance with claim 2 wherein said high thermal conductivity material is silicon.

6. A transducer in accordance with claim 2 wherein said high thermal conductivity material is silicon carbide.

7. A transducer in accordance with claim 6 wherein the silicon plate comprises a plurality of laminated, etched silicon wafers joined together in the plane.

8. A transducer in accordance with claim 6 wherein the silicon carbide plate comprises a plurality of laminated, etched silicon wafers joined together in-the-plane.

9. A transducer in accordance with claim 7 or 8 wherein said wafers are joined by fusion bonding.

10. A transducer in accordance with claim 8 wherein said wafers are joined by an intermediary glass film.

11. A transducer in accordance with claim 8 wherein said wafers are joined by an intermediary metal film.

12. A transducer in accordance with claim 1 wherein the heat regenerating region of the pressure vessel is an integrated plate comprising a low thermal conductivity material.

13. A transducer in accordance with claim 12 wherein said low thermal conductivity material is silicon dioxide.

14. A transducer in accordance with claim 13 wherein the silicon dioxide plate comprises a plurality of laminated, etched and oxidized silicon wafers joined together in-the-plane.

15. A transducer in accordance with claim 14 wherein said wafers are joined by fusion bonding.

16. A transducer in accordance with claim 14 wherein said wafers are joined by an intermediary glass film.

17. A transducer in accordance with claim 14 wherein said wafers are joined by an intermediary metal film.

18. A transducer in accordance with claim 3 wherein the integrated heat accepting, heat regenerating, and heat rejecting plates are joined together into an integrated structure.

19. A transducer in accordance with claim 18 wherein said plates are joined by silicon fusion bonding.

20. A transducer in accordance with claim 18 wherein said plates are joined by an intermediary glass film.

21. A transducer in accordance with claim 18 wherein said plates are joined by an intermediary metal film.

22. A transducer in accordance with claim 2 or 3 or 4 wherein:
   a) a thermal energy source is thermally linked to a high temperature heat accepting region of the pressure vessel;

b) A hot regenerative displacer for a thermomechanical transducer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer is interposed between the high temperature heat accepting region of the pressure vessel and the heat rejecting region of the pressure vessel and operates to regeneratively heat and cool the working fluid as the working fluid is alternately transported between said heat accepting and heat rejecting regions;

c) the heat rejecting region of the pressure vessel includes a piston for alternately compressing and expanding the working fluid; and d) an energy conveying link from the piston to a load for operating the transducer as an engine to drive the load.

23. A transducer in accordance with claim 22 wherein said load is a fluid pump.

24. A transducer in accordance with claim 22 wherein said thermal energy source is an electrically resistive film on the exterior of the of the high temperature heat accepting region of the pressure vessel.

25. A transducer in accordance with claim 22 wherein said thermal energy source is an electrically resistive film on the end of the heat regenerator nearer to the high temperature heat accepting region of the pressure vessel.

26. A transducer in accordance with claim 2 or 3 or 4 wherein:

a) a thermal energy source is thermally linked to a low temperature heat accepting region of the pressure vessel;

b) A cold regenerative displacer for a thermomechanical transducer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer is interposed between the low temperature heat accepting region of the pressure vessel and the heat rejecting region of the pressure vessel and operates to regeneratively heat and cool the working fluid as the working fluid is alternately transported between said heat accepting and heat rejecting regions;

c) the heat rejecting region of the pressure vessel includes a piston for alternately compressing and expanding the working fluid; and d) an energy conveying link from the piston to a motive power means for operating the transducer as an cooler to lower the temperature of the low temperature heat accepting region of the pressure vessel.

27. A transducer in accordance with claim 26 wherein said motive power means is an electrical motor.

28. A transducer in accordance with claim 2 or 3 or 4 wherein:

a) a thermal energy source is thermally linked to a high temperature heat accepting region of the pressure vessel;

b) a hot regenerative displacer for a thermomechanical transducer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer is interposed between the low temperature heat accepting region of the pressure vessel and the heat rejecting region of the pressure vessel and operates so as to regeneratively heat and cool the working fluid as the working fluid is alternately transported between said heat accepting and heat rejecting regions;

c) the heat rejecting region of the pressure vessel includes a piston for alternately compressing and expanding the working fluid; and d) an energy conveying link from the piston to a load for operating the transducer as an engine to drive the load wherein said load is a second transducer in accordance with claim 2 or 3 or 4 wherein:

i) a thermal energy source is thermally linked to a low temperature heat accepting region of the pressure vessel;

ii) a cold regenerative displacer for a thermomechanical transducer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer is interposed between the low temperature heat accepting region of the pressure vessel and the heat rejecting region of the pressure vessel and operates to regeneratively heat and cool the working fluid as the working fluid is alternately transported between said heat accepting and heat rejecting regions;

iii) the heat rejecting region of the pressure vessel includes a piston for alternately compressing and expanding the working fluid; and iv) an energy conveying link from the piston to the engine for operating the second transducer as an cooler to lower the temperature of the low temperature heat accepting region of the pressure vessel.

29. A transducer in accordance with claim 2 or 3 or 4 wherein:

a) a thermal energy source is thermally linked to a high temperature heat accepting region of the pressure vessel;

b) a thermal energy source is thermally linked to a low temperature heat accepting region of the pressure vessel;

c) a hot regenerative displacer for a thermomechanical transducer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer is interposed between the high temperature heat accepting region of the pressure vessel and the heat rejecting region of the pressure vessel and operates to regeneratively heat and cool the working fluid as the working fluid is alternately transported between said heat accepting and heat rejecting regions; and d) a cold regenerative displacer for a thermomechanical transducer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer is interposed between the low temperature heat accepting region of the pressure vessel and the heat rejecting region of the pressure vessel and operates to regeneratively heat and cool the working fluid as the working fluid is alternately transported between said heat accepting and heat rejecting regions.

30. A transducer in accordance with claim 1 wherein said displacer is a regenerative displacer comprising an integrated body forming a heat regenerator in the boss mass of a working fluid displacer which reciprocates to alternately transport a working fluid through the heat regenerator, and a reticulated network of walls surrounding the working fluid displacer for supporting the working fluid displacer and for connecting the working fluid displacer to other parts of the thermomechanical transducer.

31. A regenerative displacer in accordance with claim 30 wherein the integrated body comprises a low thermal conductivity material.

32. A transducer in accordance with claim 31 wherein said low thermal conductivity material is silicon dioxide.

33. A regenerative displacer in accordance with claim 30 wherein the working fluid displacer comprises a plurality of parallel, axially spaced annular diaphragms connected centrally to the boss mass and peripherally to the walls.

34. A working fluid displacer in accordance with claim 33 wherein said annular diaphragms are flat sheets.

35. A working fluid displacer in accordance with claim 33 wherein said annular diaphragms have annular corrugations.

36. A regenerative displacer in accordance with claim 33 wherein the central boss mass comprises an axially perforate matrix forming the regenerator and having continuously connected voids providing axial working fluid flow paths through the regenerator.

37. A regenerative displacer in accordance with claim 34 wherein the perforate matrix comprises a plurality of parallel, spaced planar walls defining passages between the walls having across-sectional aspect ratio greater than substantially 8.

38. A regenerative displacer in accordance with claim 33 wherein the displacer is mechanically resonant at substantially the operating frequency of the thermomechanical transducer of which it is a part.

39. A regenerative displacer in accordance with claim 38 wherein the walls define a work space of the transducer and the work space comprises a gas spring having a characteristic spring constant acting upon the displacer and wherein the displacer boss mass and displacer diaphragm spring constant together with the gas spring constant are selected to resonate the displacer at substantially the operating frequency of the transducer.

40. A regenerative displacer in accordance with claim 30 wherein the walls comprise a reticulated network of cells.

41. A regenerative displacer in accordance with claim 40 wherein the reticulated network of cells form a sealed pressure vessel.

42. A regenerative displacer in accordance with claim 40 wherein at least some of the cells are evacuated.

43. A regenerative displacer in accordance with claim 30 wherein the lateral surface of the regenerator forms a sealed pressure vessel.

44. A method for constructing thermomechanical transducers, the method comprising:

(a) etching away selected portions of a silicon wafer to form a plurality of integrated heat accepting regions in a unitary heat accepting plate;

(b) etching away selected portions of a silicon wafer to form a plurality of integrated heat rejecting regions in a unitary heat rejecting plate;

(c) forming a unitary regenerative displacer plate having a plurality of integrated regenerative displacer components; and (d) interposing, aligning in registration and joining the regenerative displacer plate between the heat accepting plate and the heat rejecting plate to form a unitary structure comprising a plurality of integrated thermomechanical transducers.

45. A method in accordance with claim 44 further comprising separating the unitary structure between selected transducers to form arrays of transducers.

46. A method in accordance with claim 45 further comprising separating the unitary structure between transducers to form a plurality of individual transducers.

47. A method in accordance with claim 44 for constructing said plurality of integrated regenerative displacer components as a unitary plate of low thermal conductivity material, the method comprising:

(a) etching away selected portions of silicon wafers to form a plurality of regenerator fins, displacer diaphragms attached to the displacer fins, and walls surrounding the diaphragms;

(b) oxidizing the resulting etched wafers; and (c) aligning and joining the resulting oxidized and etched wafers together in-the-plane to form a unitary structure comprising a plurality of such components.

* * * * *